(12) United States Patent
Youtsey et al.

(10) Patent No.: US 10,685,843 B2
(45) Date of Patent: Jun. 16, 2020

(54) DEEP PHOTOENHANCED WET MATERIAL ETCHING USING HIGH-POWER ULTRAVIOLET LIGHT EMITTING DIODES

(71) Applicant: MICROLINK DEVICES, INC., Niles, IL (US)

(72) Inventors: Christopher Youtsey, Libertyville, IL (US); Robert McCarthy, Chicago, IL (US)

(73) Assignee: MICROLINK DEVICES, INC., Niles, IL (US)

( * ) Notice: Subject to any disclaimer, the term of this patent is extended or adjusted under 35 U.S.C. 154(b) by 10 days.

(21) Appl. No.: 16/044,448

(22) Filed: Jul. 24, 2018

(65) Prior Publication Data

US 2019/0088494 A1    Mar. 21, 2019

Related U.S. Application Data

(60) Provisional application No. 62/536,224, filed on Jul. 24, 2017.

(51) Int. Cl.
*H01L 21/306* (2006.01)
*H01L 21/3063* (2006.01)
(Continued)

(52) U.S. Cl.
CPC .... *H01L 21/30612* (2013.01); *H01L 21/0254* (2013.01); *H01L 21/02389* (2013.01);
(Continued)

(58) Field of Classification Search
CPC ......... H01L 21/30612; H01L 21/02389; H01L 21/02458; H01L 21/0254; H01L 21/02664;
(Continued)

(56) References Cited

U.S. PATENT DOCUMENTS 5,773,369 A * 6/1998 Hu ........................... C25F 3/12
                                                              205/655
9,666,677 B1    5/2017 Raring et al.
(Continued)

OTHER PUBLICATIONS

Bardwell, et al., a Simple Wet Etch for GaN. J Electron Mater. Oct. 1999;28(10)L24-L26.
(Continued)

*Primary Examiner* — Zandra V Smith
*Assistant Examiner* — Andre C Stevenson
(74) *Attorney, Agent, or Firm* — McCarter & English, LLP; David R. Burns

(57) ABSTRACT

Methods and systems for etching a substrate using photoenhanced wet etching techniques are described. At least one light emitting diode source is used to create a high intensity of ultraviolet light at the surface of the substrate or at one or more layers formed on the substrate. Etching rates in GaN substrates and GaN layers are improved by an order of magnitude over conventional systems. Systems and methods for forming a device structure free of a substrate are described. The device structure is grown or applied over a release layer on a substrate. The device structure is exposed to photoenhanced wet etch environments to vertically and laterally etch the release layer to separate the device structure from the substrate.

25 Claims, 20 Drawing Sheets

(51) Int. Cl.
*H01L 31/0236* (2006.01)
*H01L 33/00* (2010.01)
*H01L 21/78* (2006.01)
*H01L 21/02* (2006.01)
*H01L 21/67* (2006.01)
*H01L 29/20* (2006.01)
*H01L 33/22* (2010.01)

(52) U.S. Cl.
CPC .. *H01L 21/02458* (2013.01); *H01L 21/02664* (2013.01); *H01L 21/30635* (2013.01); *H01L 21/67075* (2013.01); *H01L 21/67086* (2013.01); *H01L 21/78* (2013.01); *H01L 21/7813* (2013.01); *H01L 29/2003* (2013.01); *H01L 31/02363* (2013.01); *H01L 33/0075* (2013.01); *H01L 33/22* (2013.01)

(58) Field of Classification Search
CPC ......... H01L 21/67075; H01L 21/67086; H01L 29/2003
See application file for complete search history.

(56) References Cited

U.S. PATENT DOCUMENTS

| | | |
|---|---|---|
| 2003/0045120 A1 | 3/2003 | Hu et al. |
| 2005/0252282 A1* | 11/2005 | Chand .................. G01Q 40/02 73/105 |
| 2006/0202223 A1* | 9/2006 | Sackrison ............... H01L 33/22 257/99 |
| 2010/0078672 A1 | 4/2010 | Moriyama et al. |
| 2011/0294281 A1 | 12/2011 | Zang et al. |
| 2013/0011656 A1 | 1/2013 | Zhang et al. |
| 2013/0214284 A1 | 8/2013 | Holder et al. |
| 2014/0003458 A1 | 1/2014 | Han |
| 2016/0053984 A1 | 2/2016 | Callaghan et al. |
| 2016/0307924 A1 | 10/2016 | Forrest et al. |
| 2017/0133362 A1 | 5/2017 | Barlow |
| 2017/0317228 A1* | 11/2017 | Sung ....................... H01L 33/44 |
| 2019/0088495 A1 | 3/2019 | Youtsey et al. |

OTHER PUBLICATIONS

Buttari et al., Selective Dry Etching of GaN Over AlGaN in BCL3/SF6 Mixtures. International Journal of High Speed Electronics and Systems. Sep. 2004;14(3)756-761.
Holz et al., High-Power 365 nm UV LED Mercury Arc Lamp Replacement for Photochemistry and Chemical Photolithography. ACS Sustain Chem Eng. Oct. 25, 2016;5(1):828-834.
Hsieh et al., Sacrificial Structure for Effective Sapphire Substrate Liftoff Based on Photoelectrochemical Etching. IEEE Photonics Technology Letters. Apr. 1, 2015;27(7):770-773.
Stonas et al., Development of gallium nitride-based MEMS structures. Transducers '03. 12th International Conference on Solid-State Sensors, Actuators and Microsystems. Digest of Technical Papers. pp. 1156-1159, Jun. 8, 2003.
Wang et al., Demonstration of thin-film GaN Schottky diodes fabricated with epitaxial lift-off. 2016 74th Annual Device Research Conference (DRC). pp. 181-182, Jun. 19-22, 2016.
Yang, Micromachining of GaN Using Photoelectrochemical Etching. A Dissertation Submitted to the Graduate School of the University of Notre Dame in Partial Fulfillment of the Requirements for the Degree of Doctor of Philosophy. 168 pages, Apr. 2005.
Youtsey et al., Dopant-Selective Photoenhanced Wet Etching of GaN. Journal of Electronic Materials. Apr. 1998;27(4):282-287.
Youtsey et al., Highly anisotropic photoenhanced wet etching of n-type GaN. Applied Physics Letters. Oct. 13, 1997;71(15):2151-3.
Youtsey et al., Rapid evaluation of dislocation densities in n-type GaN films using photoenhanced wet etching. Applied Physics Letters. Jun. 7, 1999;74(23):3537-9.
Youtsey et al., Wafer-scale epitaxial lift-off of GaN using bandgap-selective photoenhanced wet etching. Physica Status Solidi (b). Aug. 2017;254(8):1600774. 6 pages.
International Search Report and Written Opinion for Application No. PCT/US2018/043564, dated Jan. 11, 2019, 19 pages.
International Search Report and Written Opinion for Application No. PCT/US2018/043571, dated Jan. 11, 2019, 21 pages.
U.S. Appl. No. 16/044,479, filed Jul. 24, 2018, 2019/0088495, Pending.

* cited by examiner 0.04M KOH/8hrs
125 μm depth

1M KOH/12hrs
200 μm depth

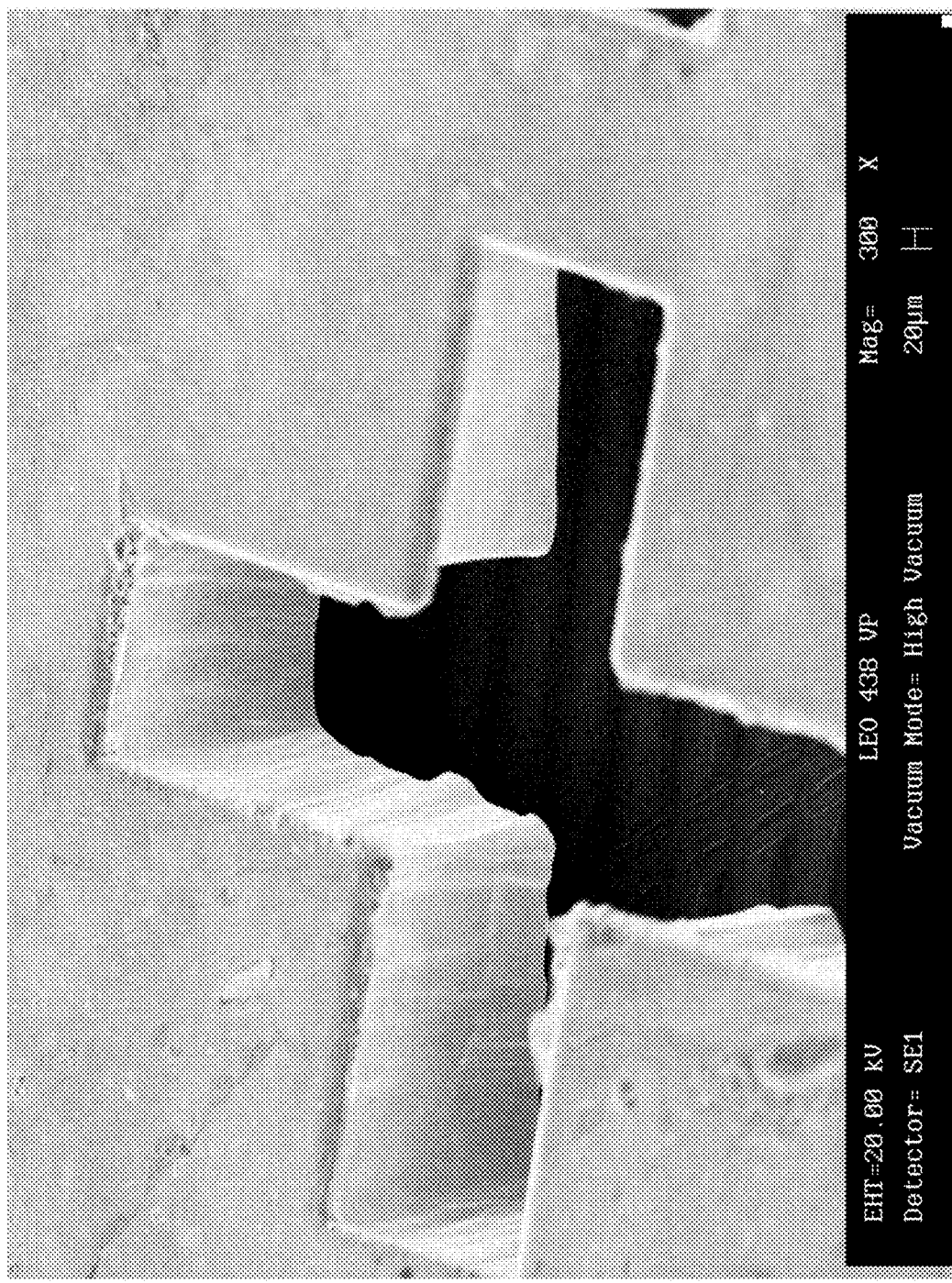
Figure 7A: Cross-shaped feature that was etched entirely through a 400-micron-thick bulk GaN wafer using LED-based photoenhanced wet etching.

Perforation formation for GaN epitaxial lift-off (ELO)

GaN ELO from 4-inch sapphire

DEEP PHOTOENHANCED WET MATERIAL ETCHING USING HIGH-POWER ULTRAVIOLET LIGHT EMITTING DIODES

RELATED APPLICATIONS

This application claims priority to U.S. Provisional Application No. 62/536,224, filed Jul. 24, 2017, the entire contents of which is incorporated herein by reference. This application is also related to a U.S. patent application titled "SYSTEMS AND METHODS FOR PERFORATION AND OHMIC CONTACT FORMATION FOR GAN EPITAXIAL LIFT-OFF USING AN ETCH STOP LAYER," filed Jul. 24, 2018, by inventors Christopher Youtsey, Robert McCarthy, and Rekha Reddy with Applicant MicroLink Devices, Inc., the entire contents of which is incorporated herein by reference.

STATEMENT OF GOVERNMENT INTEREST

This invention was made with government support under Contract No. DE-AR0000446 awarded by the United States Department of Energy's Advanced Research Projects Agency-Energy (ARPA-E). The government has certain rights in the invention.

BACKGROUND

Some materials, such as gallium nitride, are difficult to wet etch using conventional wet etchants. In some cases, photoenhanced methods can improve wet etching results. With photoenhanced methods, the material is illuminated with ultraviolet light during the wet etching process. The incident light generates electron-hole pairs which facilitate the oxidative dissolution of the semiconductor. In conventional systems, UV light sources that have typically been used for photoenhanced wet etching of GaN include UV lasers and high-pressure arc lamps. These sources are relatively expensive and large.

SUMMARY

A method of etching gallium nitride (GaN) is provided. The method comprises submerging a substrate into an etching solution in a bath, wherein the substrate comprises GaN or a layer comprising GaN is disposed over the substrate. The method comprises illuminating the substrate comprising GaN or the layer over the substrate comprising GaN using at least one light emitting diode source.

A system for photoenhanced etching of GaN is provided. The system includes a bath including an etching solution into which a substrate is submerged, wherein the substrate comprises GaN or a layer comprising GaN is disposed over the substrate. The system includes at least one light emitting diode source to illuminate the substrate comprising GaN or the layer comprising GaN disposed over the substrate.

A method for forming a GaN-based device free of a substrate is provided. The method includes providing a GaN substrate having a front surface and a back surface facing away from the front surface. The substrate comprises GaN or a layer comprising GaN is disposed over the substrate. The method includes forming a release layer over the front surface of the substrate. The release layer has a first bandgap energy level. The method includes forming one or more layers of the device over the release layer to form the GaN-based device. The method includes forming a perforated support layer on one of the device layers to form an outermost layer of a stackup that includes the substrate, the release layer, the one or more device layers, and the perforated support layer. The method includes exposing the stackup to a photoenhanced vertical wet etch environment including illuminating the perforated support layer and exposed portions of the one or more layers of the device and exposed portions of the release layer using at least one light emitting diode source to vertically etch the portions of the release layer and at least one of the one or more layers of the device. The etched portions of the release layer and at least one of the one or more layers of the device underlie perforations in the support layer. The method includes exposing the stackup to a photoenhanced lateral wet etch environment including illuminating the second surface of the substrate using at least one light emitting diode source to laterally etch the release layer. The photoenhanced lateral wet etch environment impinges photons on the release layer having an energy level greater than or equal to that of the first bandgap energy level of the release layer.

BRIEF DESCRIPTION OF THE DRAWINGS

The foregoing and other objects, features, and advantages of the invention will be apparent from the following description, and from the accompanying drawings, in which like reference characters refer to the same parts throughout the different views. The drawings illustrate principles of the invention and are not to scale (e.g., relative thicknesses of material layers are not to scale).

FIG. 7A is an SEM image of a perspective view of a feature etched completely through a bulk GaN substrate using systems and methods described in some embodiments of the present disclosure.

DETAILED DESCRIPTION

Figure 1:
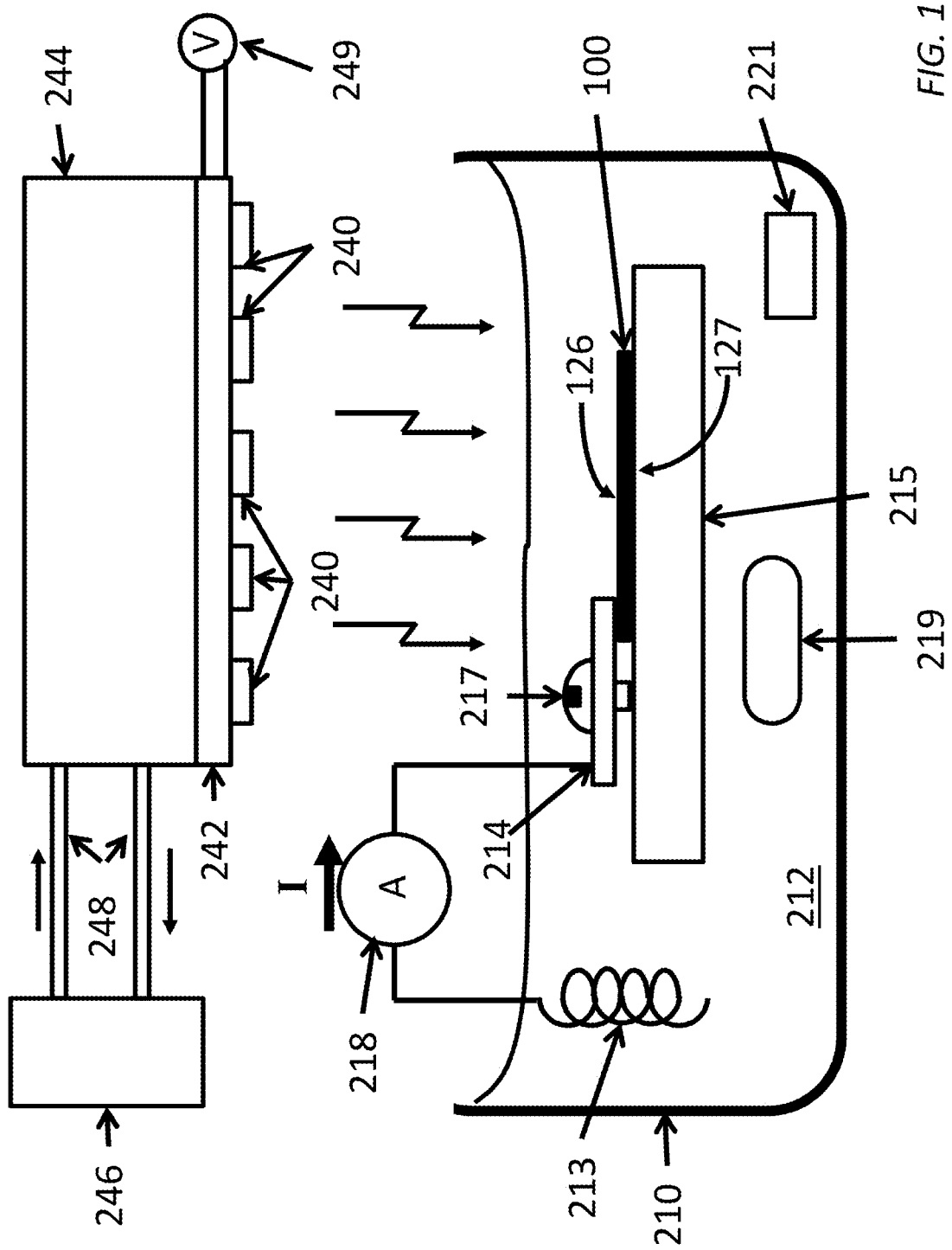
FIG. 1 schematically illustrates a system for photoenhanced etching of a substrate or a layer disposed over a substrate in accordance with some embodiments described herein.

Some systems and methods of the present disclosure employ low-cost, high-power UV light emitting diodes (LEDs) to enable deep photoenhanced wet etching of microstructures in gallium nitride (GaN) materials. Some embodiments described herein employ low-cost, high-power UV LED light sources for ultra-deep etching of structures in bulk GaN substrates or GaN layers deposited over GaN or other substrates. Ultra-deep etching can also be performed in other materials including other III-nitride semiconductor materials that are generally resistant to etching using conventional techniques.

Etching of deep, anisotropic, vertical structures (e.g., structures with depths greater than a few tens of micrometers) into some materials such as GaN has long been recognized as challenging. Unaided wet etching using potassium hydroxide (KOH) as an oxidizing/reducing agent produces slow etch rates of the order of tens of Angstroms per minute. Dry etching techniques (e.g., plasma etching) require deposition of a hard mask having a thickness of the order of the depth of the features to be etched. For features having depths of hundreds of micrometers, it is impractical to deposit hard masks of the necessary thickness that have the desired feature resolution. Moreover, dry etching processes can damage the III-nitride materials being etched in some cases due to the high energies required. As a result, a wet etch must be performed anyway after a dry etch has occurred simply to clean the surface.

Photoenhanced wet etching techniques enable highly directional (i.e., anisotropic) etching of deep structures. It has been proposed that the photoelectrochemical (PEC) etching of GaN occurs through oxidative decomposition, in which photogenerated holes assist in the oxidation and subsequent dissolution of the semiconductor into aqueous solution. Consequently, the inventors have previously postulated that the following oxidation reaction is responsible for the decomposition of GaN:

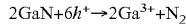

$$2GaN+6h^+ \rightarrow 2Ga^{3+}+N_2$$

Conventional systems for photoenhanced etching of GaN are generally limited to low power output, and the intensity of light at the sample suffers as a result. Previously, the practitioner using a conventional system such an arc lamp or a conventional laser would have to choose between low intensity illumination over a large area for the arc lamp and high intensity illumination over a very small area, such as by use of the conventional laser or by focusing the light from the arc lamp using focusing optics. Attempting to increase both the intensity and illuminated area using one or more arc lamp light sources would require significant increases in system complexity, number of optical components, space required for the optical components, and cost. In practice, this resulted in a functional limitation of the order of ten microns on the depth of features that could be etched. Systems and methods of the present disclosure provide a high-power light source including light emitting diode sources that can illuminate large areas with high intensities. As a result, systems and methods of the present disclosure provide for deep etching of large-scale structures (e.g., structures at the millimeter scale or larger) and/or deep etching of many devices simultaneously on a large wafer scale and on a commercially viable time scale. In some embodiments, systems and methods avoid the use of optical systems or optical components other than any optical components integrated into the individual LED light sources.

As used herein, a "light emitting diode source" is a structure that includes at least one diode light emitter but can include more than one diode light emitter. The diode light emitters can be physically or electrically separated or can be packaged as a discrete unit having, for example, a single set of electric leads and an enclosure or focusing element to protect the emitters.

As used herein, a "deep" etched structure is a structure having a vertical depth from the surface of the layer in which the structure is etched or from the surface of the device to the bottom of the feature of greater than 20 μm.

As used herein, a "vertical etch" refers to an etch that progresses primarily vertically with respect to the substrate through portions of one or more layers over the substrate towards the substrate.

As used herein, a "lateral etch" refers to an etch that proceeds primarily laterally with respect to the substrate to remove a release layer from between one or more overlying layers and a substrate.

FIG. 1 illustrates a system 200 for photoenhanced etching of a substrate 100 or a layer disposed over the substrate in accordance with some embodiments described herein. The system 200 includes a bath 210 that holds an etching solution 212 into which a substrate 100 is submerged and includes at least one light emitting diode (LED) source 240 to illuminate the substrate 100. When the substrate 100 is illuminated by the at least one LED source 240, a photo-electrochemical reaction is induced in the substrate 100 that enables selective dissolution of material in the substrate. The at least one LED source 240 provides a high light intensity at the substrate 100 to enable higher etch rates than have been reported previously. In some embodiments, one or more layers (not depicted) are disposed the substrate 100 and the photoelectrochemical reaction is induced in at least one of the one or more layers in addition to or instead of in the substrate 100 to enable selective dissolution of material of at least one of the one or more layers.

The substrate 100 has a front surface 126 and a back surface 127 in some embodiments. In embodiments in which one or more layers (not shown) disposed on the substrate 100 are selectively etched, the one or more layers can be disposed on the front surface 126. The substrate 100 can include a variety of semiconducting or other materials. In particular, the substrate 100 can include one or more III-nitride semiconductor materials. In some embodiments, the substrate 100 includes gallium nitride (GaN). In some embodiments, the substrate 100 includes aluminum nitride (AlN). In some embodiments, the substrate 100 includes aluminum gallium nitride (AlGaN) or indium gallium nitride (InGaN). In some embodiments, the substrate 100 includes materials that can be expressed stoichiometrically as $In_xAl_yGa_zN$ where x, y, and z are in a range from 0 to 1 and x+y+z=1. In embodiments where the substrate 100 includes GaN, the crystallographic structure of the GaN can be oriented as C-plane, M-plane, or A-plane, or have another orientation. A surface of the GaN can be semipolar or nonpolar in some embodiments. In embodiments in which one or more layers (not shown) disposed on the substrate 100 are selectively etched, the one or more layers include one or more III-nitride materials as explained and listed above. In some embodiments in which one or more layers (not shown) disposed on the substrate 100 are selectively etched, the one or more layers include GaN. In some embodiments in which one or more layers (not shown) disposed on the substrate 100 are selectively etched, the one or more layers include AlN.

In some embodiments, the substrate 100 can include a semiconductor wafer having a front surface 126 and a back surface 127 as used for device fabrication in the microelectronics industry. In some embodiments, at least one surface of the substrate 100 can have a diameter of at least two inches (5.08 centimeters). In some embodiments, the diameter of the surface of the substrate 100 can lie in a range from about two inches (5.08 centimeters) to about eight inches (20.32 centimeters). In some embodiments, the diameter of the surface of the substrate 100 can lie in a range from about 4 inches (10.2 cm) to about 8 inches (20.3 cm). In some embodiments, the substrate has a diameter in a range of a 2-inch wafer sized substrate to an 8-inch wafer sized substrate. In some embodiments, the substrate has a diameter in a range of a 3-inch wafer sized substrate to an 8-inch wafer sized substrate. In some embodiments, the substrate has a diameter in a range of a 4-inch wafer sized substrate to an 8-inch wafer sized substrate. In some embodiments, the substrate has a size as recited above and comprises GaN. In some embodiments, the substrate has a size as recited above and one or more layers disposed on the substrate comprise GaN.

In some embodiments, the substrate 100 is affixed to a base 215 and immersed into the etching solution 212 to begin the etch process. In some embodiments, the back surface 127 is in contact with the base 215 and the front surface 126 is exposed to the etching solution 212. As noted above, in some embodiments, device layers or structures or other layers (not shown) are disposed over the front surface 126 of the substrate 100 and an outward facing surface of the outermost layer is exposed to the etching solution. An anode 214 and cathode 213 are disposed in the etching solution 212 in order to facilitate the photoenhanced chemical etching process. The substrate 100, or a layer on the front surface 126 of the substrate 100, is electrically connected to an anode 214 while the cathode 213 is suspended in the etching solution 213 and not in physical contact with the substrate 100. In some embodiments, the anode 214 includes nickel. In some embodiments, the substrate 100 itself acts as the anode 214 and the electrical lead attaches directly to the substrate 100. In some embodiments, the cathode 213 includes platinum. The anode 214 and cathode 213 are electrically connected to enable charge transfer between them. During the photoelectrochemical etching process, electron-hole pairs are formed in the substrate 100. In embodiments in which one or more layers on the first surface 126 of the substrate are etched in addition to or instead of the substrate, electron-hole pairs are formed in the one or more layers. The holes participate in a decomposition reaction while the unpaired electrons flow from the anode to the cathode. The anode 214 and cathode 213 can be electrically connected to a current measuring device such as an ammeter 218 to monitor the level of current flow.

In some embodiments, the cathode 213 is not included in the system 200. Instead, an oxidizing agent in the etching solution 212 can be used to facilitate charge transfer and dissolution of material in the photoelectrochemical etching system. In some embodiments, the oxidizing agent can include potassium persulfate ($K_2S_2O_8$).

In some embodiments, the anode 214 can be used in conjunction with a fastener 217 to clamp or stabilize the substrate 100 to the base 215. For example, the anode 214 can be shaped as a washer and the fastener can be a screw that passes through the washer and screws into the base 215. The substrate 100 is thereby clamped between the base 215 and the anode 214.

In some embodiments, the base 215 includes a non-reactive material. For example, the base 215 includes or is formed of polytetrafluoroethylene (PTFE) in some embodiments. The front surface 126 or the back surface 127 of the substrate 100 can contact the base 215 in some embodiments. The base 215 can physically prevent etching on the contacting surface (e.g., the back surface 127) of the substrate 100 in some embodiments.

The etching solution 212 can include any formulation of chemicals or solvents that is appropriate for removal of the desired material in the substrate 100. The etching solution 212 can include potassium hydroxide (KOH) in some embodiments. In some embodiments, the etching solution 212 can include potassium persulfate ($K_2S_2O_8$), sodium hydroxide (NaOH), hydrochloric acid (HCl), tartaric acid/ ethylene glycol, phosphoric acid ($H_3PO_4$), citric acid/hydrogen peroxide, tetramethylammonium hydroxide (TMAH), or various combinations of these chemicals with or without KOH. In some embodiments, the molarity of KOH in the etching solution can be in a range from 0.01 M to 10 M. In some embodiments, the molarity of KOH in the etching solution 212 can be in a range from 0.1M to 2M. In some embodiments, the molarity of KOH in the etching solution 212 can be in a range from 0.1M to 1M.

Figure 2:
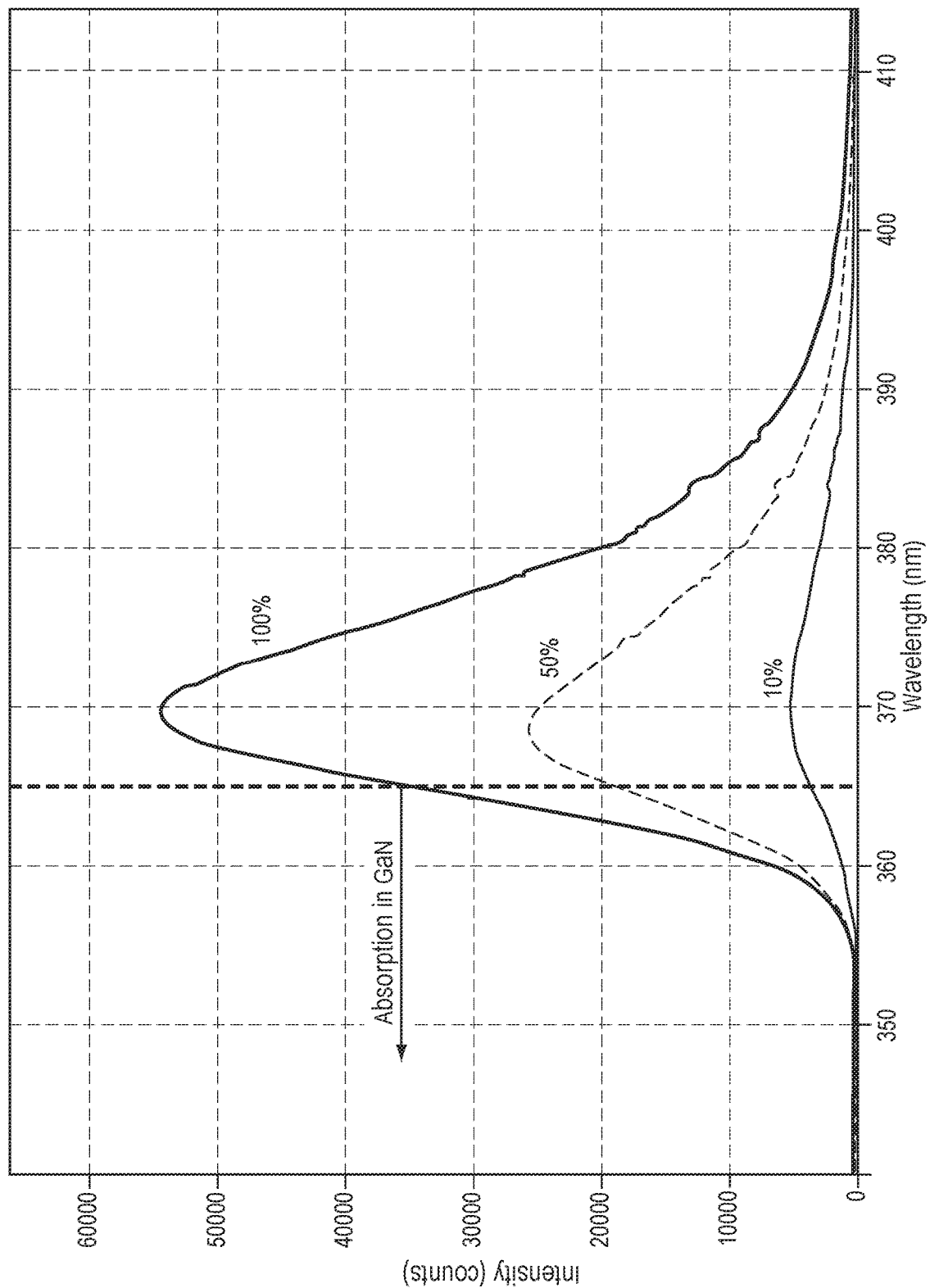
FIG. 2 is a graph of relative intensity versus wavelength of light emission for spectra obtained from an exemplary light emitting diode (LED) source 240 when operated at power levels of 10%, 50%, and 100% of maximum rated output power.

The LED source 240 emits light at a wavelength that can be absorbed by the substrate 100, or in embodiments where one or more layers disposed over the substrate are etched, at a wavelength that can be absorbed by the one or more layers. For materials that exhibit a bandgap, this means that the light emitting diode source 240 must generate photons with wavelengths shorter than or equal to the bandgap energy so that the photons will be absorbed. Put another way, the photons must have higher than or equal energy compared to the bandgap energy in the layer that is to absorb the photons. For example, the wavelength corresponding to the energy bandgap of GaN is approximately 365 nm at room temperature. In some embodiments, the light emitting diode source 240 emits light at a nominal wavelength of 365 nm. Although many manufacturers provide nominal wavelengths for light emitting diode products, the actual center wavelength can generally be located between 367-370 nm. FIG. 2 illustrates relative spectra obtained from an exemplary light emitting diode source 240 when operated at power levels of 10%, 50%, and 100% of maximum rated output power. The left tail of each spectrum extends below 365 nm, and only this portion of each spectrum will be absorbed in a GaN substrate 100 or GaN layer grown on a substrate 100.

Turning again to FIG. 1, in some embodiments, the at least one LED source 240 is or can be mounted to or electrically connected with a circuit board 242. The circuit board 242 includes a metal core in some embodiments. The metal core can provide the circuit board 242 with a high thermal conductivity to enable the LED sources 240 to discharge thermal energy efficiently in embodiments where the LED sources 240 are in thermal contact with the circuit board 242. In some embodiments, a voltage source 249 can connect to the circuit board 242. Traces on the circuit board can transmit power from the voltage source 249 to each of the light emitting diode sources 240. In other embodiments, each LED source 240 can independently connect electrically to the voltage source 249 (or to multiple voltage sources 249).

The circuit board 242 is in thermal contact with a heat sink 244 in some embodiments. In some embodiments, the LED sources 240 are in thermal contact with the heat sink 244 directly or through the circuit board 242. The heat sink 244 dissipates thermal energy generated by the LED sources 240 or associated electronics. In some embodiments, the heat sink 244 is gas-cooled (e.g., air-cooled) or liquid-cooled. The heat sink 244 includes ventilation fins or structures in some embodiments. In some embodiments, the system 200 includes a fluid chiller 246 that removes hot fluid from the heat sink 244 and returns chilled fluid to the heat sink 244 using conduction pipes 248. In some embodiments, the fluid that circulates through the chiller 246 and heat sink 244 is water. In some embodiments, the heat sink 244 is configured to remove an amount of power in a range of 100 to 300 Watts. In some embodiments, the heat sink 244 is configured to continuously remove between 5 W/cm$^2$ and 20 W/cm$^2$ of power per unit area of illumination at an illumination output of the array of LED sources.

Temperature effects can shift the spectral emission distribution of the LED sources to longer or shorter wavelengths. For example, as the bias current is increased in each LED source 240 and the LED sources 240 consequently heat up, the spectral distribution of each LED source 240 will shift to longer wavelengths. In the example of a GaN substrate 100 or a substrate 100 on which is disposed a layer of GaN, the relative amount of energy in the spectral distribution below 365 nm is reduced as the temperature heats up (i.e., the spectra shown in FIG. 2 shift to the right). By thermally connecting the LED sources 240 to a heat sink 246 to reduce heat build up, LED sources 240 can operate at high powers while mitigating the shifting of the spectrum to longer wavelengths that is caused by heating of the LED sources 240.

In some embodiments, the system 200 includes a heating element 221 that can heat the etching solution 212. By heating the etching solution 212 using the heating element 221, the substrate 100 and any layers disposed thereon are also heated. When the substrate 100 and any layers disposed on the substrate are heated, the absorption edge of the material in the substrate 100 and/or of the material in one or more layers on the substrate to be etched is shifted to longer wavelengths. As a result, the fraction of the spectrum output by the LED sources 240 that can be absorbed by the material to be etched is increased.

In some embodiments, the system 200 includes stirring mechanism 219 to stir the etching solution 212. The stirring mechanism 219 can include a magnetic stirrer or stirbar, a vortexer, or other fluid mixing agent in some embodiments. The stirring mechanism 219 can help circulate the etching solution 212 in the bath 210. In some embodiments, the stirring mechanism 219 helps distribute heat in the bath 210 by circulating locally heated etching solution 212 in the vicinity of the heating element 221 to other parts of the bath 210. In some embodiments, cooling of the LED sources 240 and heating of the etching solution 212 can be employed together in a system to provide greater control of wavelength shift and light absorption.

As explained above, in embodiments in which the substrate 100 is etched, the substrate includes a III-nitride compound (e.g., GaN). In embodiments in which the substrate 100 and one or more layers on the substrate are etched, the substrate and at least one of the one or more layers can include a III-nitride compound (e.g., GaN). In embodiments in which the substrate 100 is not etched, but one or more layers on the substrate are etched, the substrate 100 may not include a III-V compound (e.g., the substrate may be a sapphire substrate) and one of the one or more layers on the substrate can include a III-nitride compound base layer (e.g., a GaN base layer or an AlN base layer) for epitaxial growth of other layers on the substrate.

Figure 3:
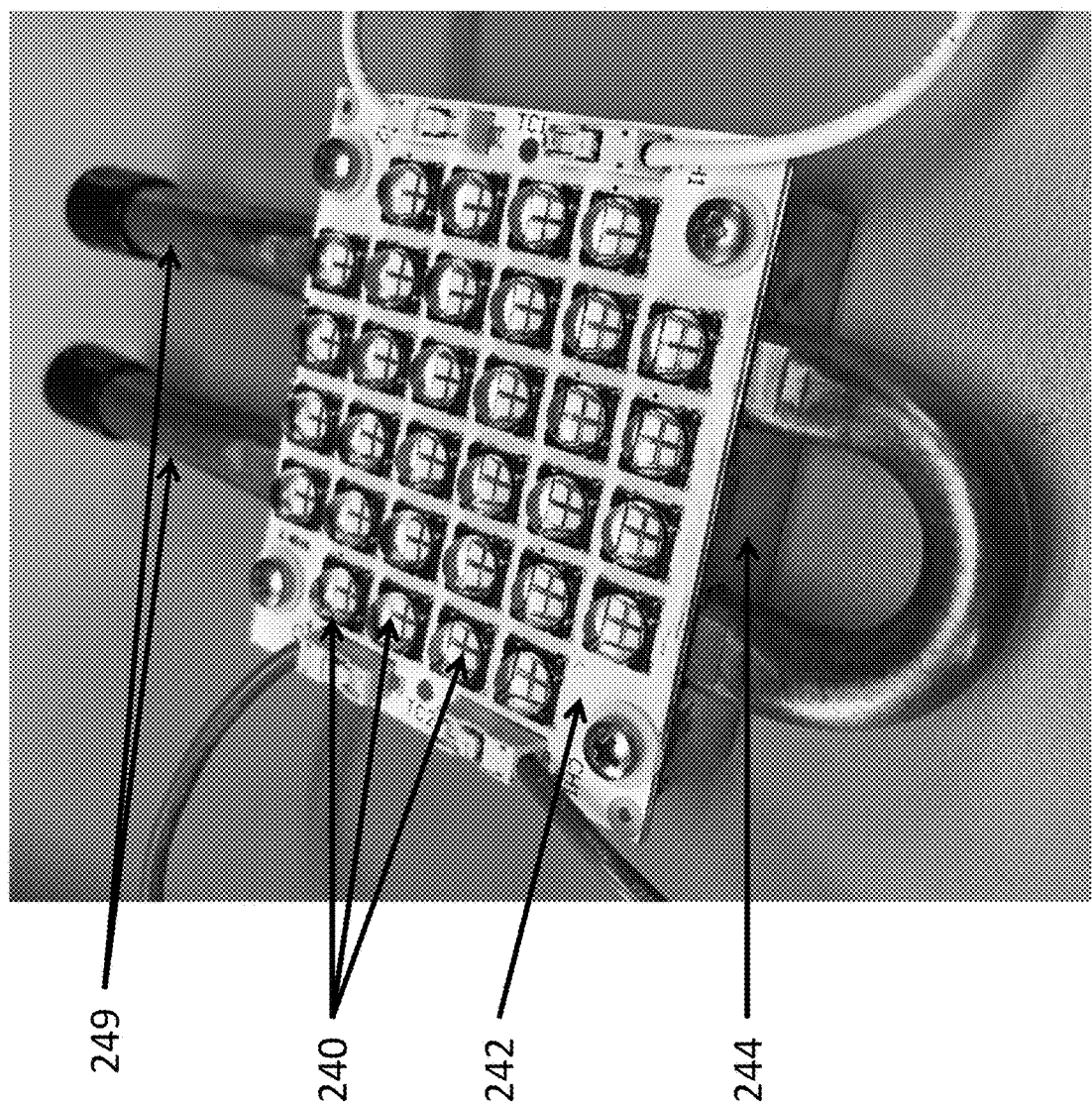
FIG. 3 is an image of an array of LED sources 240 cooled by a water-cooled heat sink in accordance with some embodiments described herein.

FIG. 3 illustrates the at least one LED source 240, circuit board 242, and heat sink 244 according to various embodiments described herein. In some embodiments, the system 200 can include between one and two hundred LED sources 240 per wafer to be etched by the system at one time. In some embodiments, the system includes one or more arrays of LED sources 240. In some embodiments, each array is configured to illuminate a sample or wafer to be etched. In some embodiments, the system 200 can include an array of thirty-two LED sources 240 configured to illuminate a single sample or wafer. In some embodiments, the array of LED sources form at least a part of an optical system where the optical system has an illumination output area that depends, in part, on the area over which the array of LED sources are disposed. In accordance with an exemplary embodiment, the LED sources 240 can be distributed over an area of approximately 2×2 inches square (5.08 cm×5.08 cm centimeters). One of ordinary skill in the art would appreciate that the system 200 can include any number of LED sources 240 positioned at an appropriate spacing and having appropriate power to expose the GaN substrate to an appropriate flux of photons in accordance with the disclosure provided herein. As shown in FIG. 3, the LED sources 240 can be placed in a compact arrangement to minimize the footprint of the illumination source of the system 200. In some embodiments, the intensity of light as measured at the output of the illumination system can be in a range from 0.1 W/cm² to 100 W/cm². In some embodiments, the intensity of light as measured at the output of the illumination system can be in a range of 1 W/cm² to 100 W/cm². In some embodiments, the intensity of light as measured at the output of the illumination system can be in a range of 1 W/cm² to 40 W/cm². In some embodiments, the intensity of light as measured at the output of the illumination system can be in a range of 2 W/cm² to 20 W/cm². In some embodiments, the intensity of light as measured at the output of the illumination system can be in a range of 2 W/cm² to 10 W/cm². In some embodiments, the intensity of light as measured at the output of the illumination system can be in a range of 2 W/cm² to 4 W/cm².

In FIG. 3, each of the depicted LED sources 240 includes four emitters and a focusing element combined in a single LED package. In accordance with various embodiments, each LED source 240 in the system 200 can include one, two, three, four, or more emitters depending upon package design as one of ordinary skill in the art would appreciate. By their nature, LED emitters tend to emit over a large solid angle. When light emitted by the emitter does not reach the substrate 100, overall efficiency in the system is reduced. In some embodiments, each LED source 240 can includes a focusing element to direct light from the LED source 240 in a more forward direction and prevent the loss of photons from the system at high angles. In some embodiments, the focusing element is integrated into the LED package. In some embodiments, an emission half-angle of the at least one LED source 240 is 50° or less.

In some embodiments, the power rating of each LED source 240 can lie in a range from 1 Watt to 100 Watts, or in a range from 1 Watt to 20 Watts, or in a range from 1.5 Watts to 4 Watts. In exemplary embodiments, the power rating of each LED source 240 can be about 10 Watts. In some implementations, the LED sources 240 of the system 200 can provide a combined optical power in a range from 50 W to 300 W to illuminate an area in a range of 4 to 710 cm². The power consumed by the one or more LED light sources per area illuminated for etching may fall in a range of 50 W/in² (7.8 W/cm²) to 200 W/in² (31 W/cm²), or 50 W/in² (7.8 W/cm²) to 150 W/in² (23.2 W/cm²), or 50 W/in² (7.8 W/cm²) to 100 W/in² (15.5 W/cm²). The system 200 can produce the intensity across substantially the entire surface of the substrate 100 having a diameter of 2 inches, 4 inches, 6 inches, or 8 inches in some embodiments. In some embodiments, the system 200 can produce an intensity of light across the entire surface of the substrate 100 (e.g., the substrate having a diameter in a range from 2 inches to 8 inches) or an entire surface of a layer disposed over the substrate 100 (e.g., the substrate having a diameter in a range from 2 inches to 8 inches) in a range between 1 W/cm² and 40 W/cm². In some embodiments, the system 200 can produce an intensity of light across the entire surface of the substrate 100 (e.g., the substrate having a diameter in a range from 2 inches to 10 inches) or an entire surface of a layer disposed over the substrate 100 (e.g., the substrate having a diameter in a range from 2 inches to 10 inches) in a range between 4 W/cm² and 6 W/cm². Advantageously, the high intensities produced by systems described herein across large areas (e.g., an entire two, four, six, or eight inch wafer-size substrate 100) enables etching of deep features over commercially realistic time frames (e.g., hours). In some embodiments, the high intensity of light produced by the system over large areas is enabled by arrangement of LED sources into an array. In the array, LED sources can be closely spaced to increase optical power per unit area.

In some embodiments, the system 200 achieves a uniformity for at least one etching parameter across the surface of the substrate with variation of less than 10%. The etching parameter can be any one of etch depth, etched feature width, or surface roughness in different instances. The high uniformity for the etching parameter for structures formed in accordance with systems and methods described herein derives from the uniform illumination provided by the arrangement of LED sources 240 in the system 200.

In conventional systems, high intensities over a large substrate area are not possible because the output optical power from the source (e.g., mercury arc lamp) is typically relatively low. To increase the intensity at a local portion of the substrate, conventional systems may use focusing optics to gather flux and concentrate it over a very small area. In some embodiments described herein, while the LED sources 240 themselves can include a focusing element as part of the package, no additional focusing optics are placed between the LED sources 240 and the substrate 100. By removing the need to include focusing optics in the illumination system, the illumination system can be made significantly more compact and simplified and alignment of the substrate 100 in the system is simplified.

Figure 4:
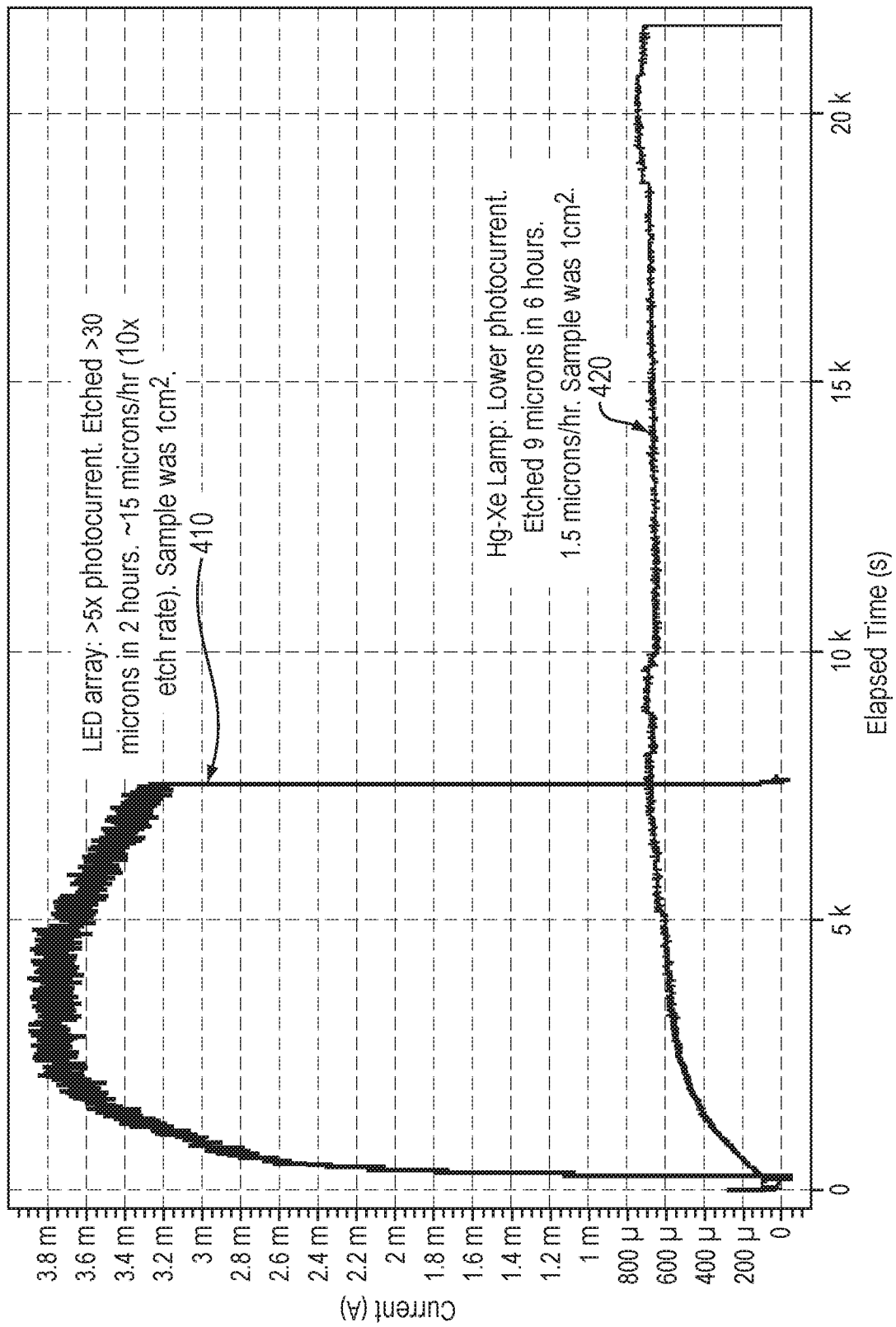
FIG. 4 is a graph of measured photocurrent over time during etching in a system according to some embodiments of the present application as compared to measured photocurrent over time during etching in a conventional system employing a lamp.

FIG. 4 illustrates measured photocurrent in the system 200 according to an embodiment of the present application that employed an LED array as compared to measured photocurrent in a conventional system that employed a Hg—Xe lamp. According to Faraday's law of electrolysis, the current flow between the substrate 100 or layer disposed on the substrate (i.e., acting as the anode 214) and the cathode 213 is proportional to the reaction rate at the semiconductor/electrolyte interface and, therefore, the current flow provides an instantaneous measure of the etch rate of the substrate 100 or layer on the substrate 100.

The substrate 100 including GaN and having a top surface area of 1 cm² was placed into the system 200 and illuminated using the LED sources 240 (see FIG. 3). The generated photocurrent was measured at the ammeter 218 (see FIG. 1). The curve 410 in FIG. 4 corresponding to an embodiment of the system 200 described herein peaks at nearly 3.8 mA of generated current, and features were etched into the substrate 100 at a rate of nearly 15 microns/hour. A similar sample of area 1 cm² was placed into a conventional system that includes a conventional Hg—Xe lamp light source. The resulting photocurrent curve 420 for the conventional system has a maximum value of approximately 750 μA, and features were etched into the substrate 100 at a rate of only 1.5 microns/hour. Thus, systems and methods of the present disclosure can produce much higher etch rates than those seen in conventional systems. These high etch rates make it feasible to etch substrates at a commercially viable timescale (i.e., substrates can be etched on the order of hours rather than the order of days). In some embodiments, the system 200 etches a resulting structure (e.g., a trench, feature, or perforation) into the substrate 100 or into one or more layers on the substrate 100 at a rate between 5 micrometers per hour and 250 micrometers per hour. In some embodiments, the system 200 etches the resulting structure into the substrate 100 or into one or more layers on the substrate 100 at a rate between 5 micrometers per hour and 100 micrometers per hour. In some embodiments, the system 200 etches the resulting structure into the substrate 100 or into one or more layers on the substrate 100 at a rate between 5 micrometers per hour and 50 micrometers per hour. In some embodiments, the system 200 etches the resulting structure into the substrate 100 or into one or more layers on the substrate 100 at a rate between 10 micrometers per hour and 50 micrometers per hour. In some embodiments, the system 200 etches the resulting structure into the substrate 100 or into one or more layers on the substrate 100 at a rate between 10 micrometers per hour and 30 micrometers per hour. In some embodiments, the system 200 etches the resulting structure into the substrate 100 or into one or more layers on the substrate 100 at a rate between 9 micrometers per hour and 20 micrometers per hour. In an exemplary embodiment, the system 200 etches the resulting structure into the substrate 100 or into one or more layers on the substrate 100 at a rate of around 15 micrometers per hour.

Figure 5:
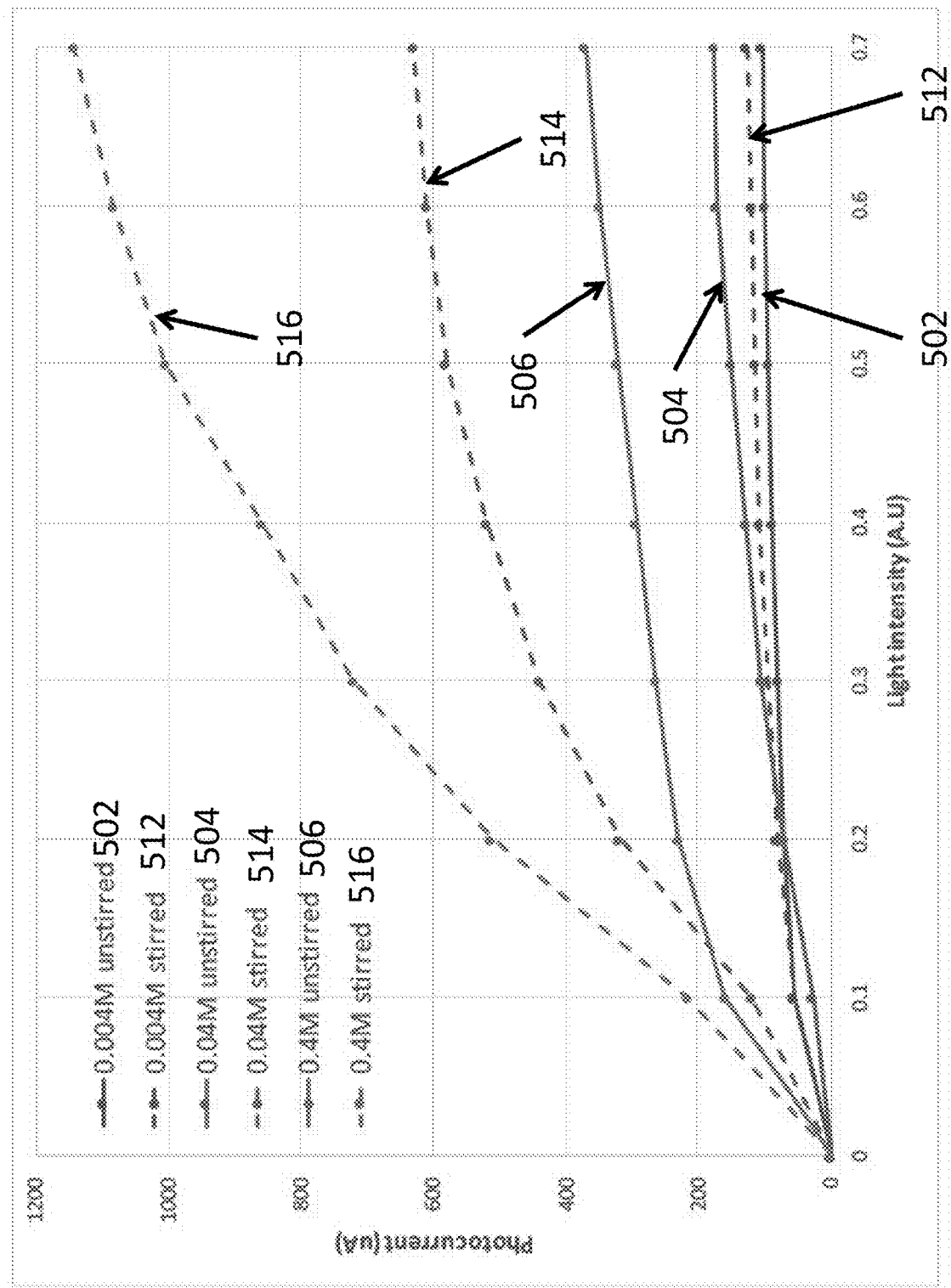
FIG. 5 is a graph of measured photocurrent versus light intensity in systems under different etchant concentration and stirring conditions according to some embodiments described herein.

FIG. 5 illustrates measured photocurrent in systems 200 under different etchant concentration and stirring conditions according to various embodiments described herein. By changing stirring and etchant concentration conditions, the kinetics of PEC etching methods can be determined. Because it is more difficult to grow good quality electronic material on the N-face of a C-plane material, GaN-based devices are more often made on the Ga-face of a GaN substrate. Accordingly, much of the experimental data below is from etching on the Ga-face of a C-plane material. However, in some embodiments, etching could be performed on the N-face of a substrate, such as to form vias or for dicing. In some embodiments, semipolar or nonpolar substrates, such as M-plane or A-plane GaN substrate could be used.

The depicted curves show Ga-face photocurrent as a function of light intensity, KOH concentration, and stirring. The proportionality of photocurrent to etch rate is shown. The curves 502 and 512 illustrate photocurrent for the system 200 with a 0.004 M KOH etching solution 212 wherein the solution is unstirred and stirred, respectively. The curves 504 and 514 illustrate photocurrent for the system 200 with a 0.04 M KOH etching solution 212 wherein the solution is unstirred and stirred, respectively. The curves 506 and 516 illustrate photocurrent for the system 200 with a 0.4 M KOH etching solution 212 wherein the solution is unstirred and stirred, respectively. Increasing the etchant concentration in the etching solution 212 and stirring the etching solution 212 (e.g., using a stirring mechanism 219) create increased photocurrent generation and, thus, increased etch rates.

Figure 6A:
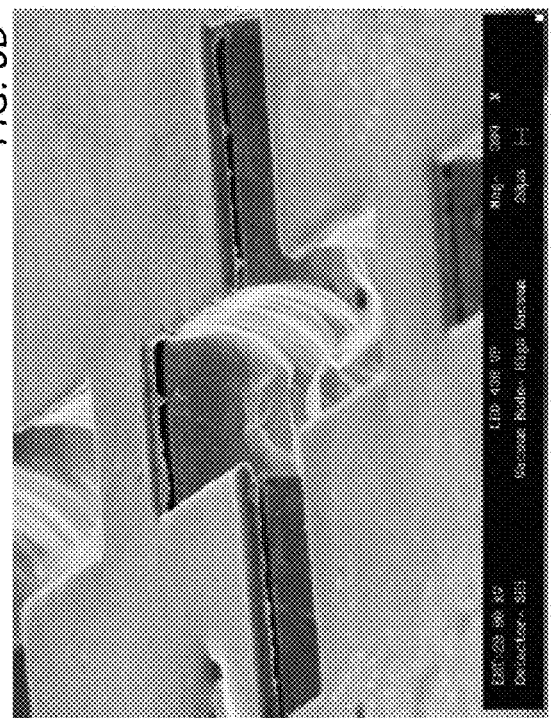
FIG. 6A is a scanning electron microscopy (SEM) image of a feature etched into a gallium nitride (GaN) bulk substrate using systems and methods described in some embodiments of the present disclosure.

FIG. 6A is an SEM image of a feature etched into a gallium nitride (GaN) bulk substrate using systems and methods described in embodiments of the present disclosure. SEM images of the same feature at progressively greater zoom levels appear in FIG. 6B and FIG. 6C. The cross-shaped feature was etched to a depth of 125 microns using a stirred 0.04 M KOH etching solution 212 in the system 200 described above. This deep etching was carried out on the gallium face of a bulk GaN substrate 100 with a thickness of 400 microns (SCIOCS Company Limited, Hitachi, Japan) having a 15-micron epitaxial layer. In this example, the etch rate was approximately 15 microns/hour, and etching proceeded for 8 hours. The etch profile is remarkably vertical, driven by the directionality of the incident light. FIG. 6C illustrates a close-up view of the metal etch mask layer, the 15-µm-thick n-GaN epitaxial layer, and the bulk GaN substrate grown by hydride vapor phase epitaxy (HVPE). In accordance with some embodiments described herein, a resulting structure etched into the substrate or into one or more layers of the substrate has a depth of greater than 10 micrometers. The depth of the resulting structure can be in a range from 10 micrometers to 1000 micrometers (1 mm) in some embodiments. The depth of the resulting structure can be in a range from 10 micrometers to 500 micrometers in some embodiments. In some embodiment, a resulting etched structure extends entirely through the substrate and a total thickness etched where the etch extends entirely through the substrate has a range from 10 micrometers to 1 mm, or from 10 micrometers to 500 micrometers.

Figure 6D:
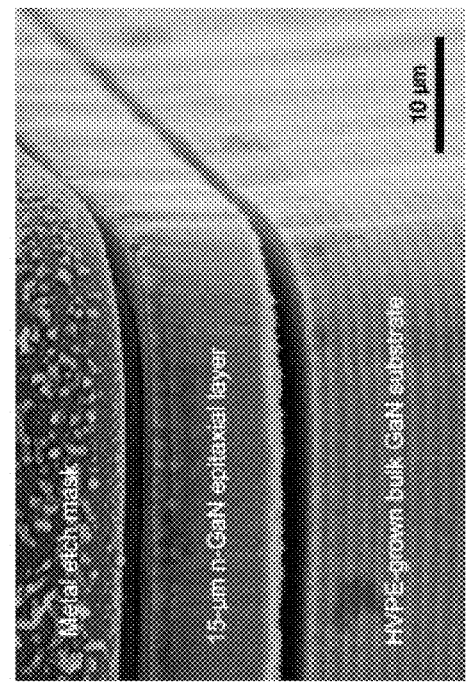
FIG. 6D is an SEM image of a feature etched into a GaN bulk substrate under different conditions than the feature of FIGS. 6A-6C in accordance with some embodiments described herein.
Figure 6B:
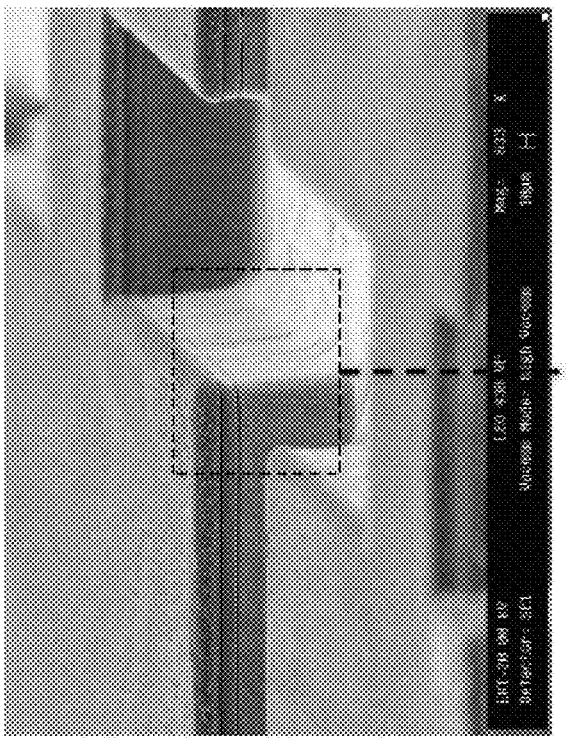
FIG. 6B is a detail view of FIG. 6A.
Figure 6C:
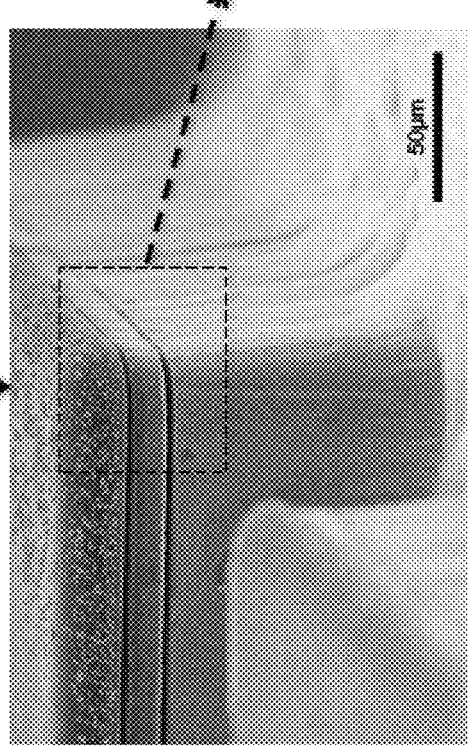
FIG. 6C is a detail view of FIG. 6B showing different layers.

FIG. 6D is an SEM image of a feature etched into a GaN bulk substrate under different conditions than the feature of FIGS. 6A-6C in accordance with various embodiments described herein. The cross-shaped feature shown in FIG. 6D was etched in a 1 M KOH chemistry for 12 hours. The feature was etched to a depth of 200 microns. As can be seen in the figures, the characteristics of etched features can differ at different etchant concentrations. For example, higher etchant concentrations can produce faster etch rates, but they also tend to produce features that are more crystallographic (i.e., the etch hews strongly to crystallographic planes).

Figure 7B:
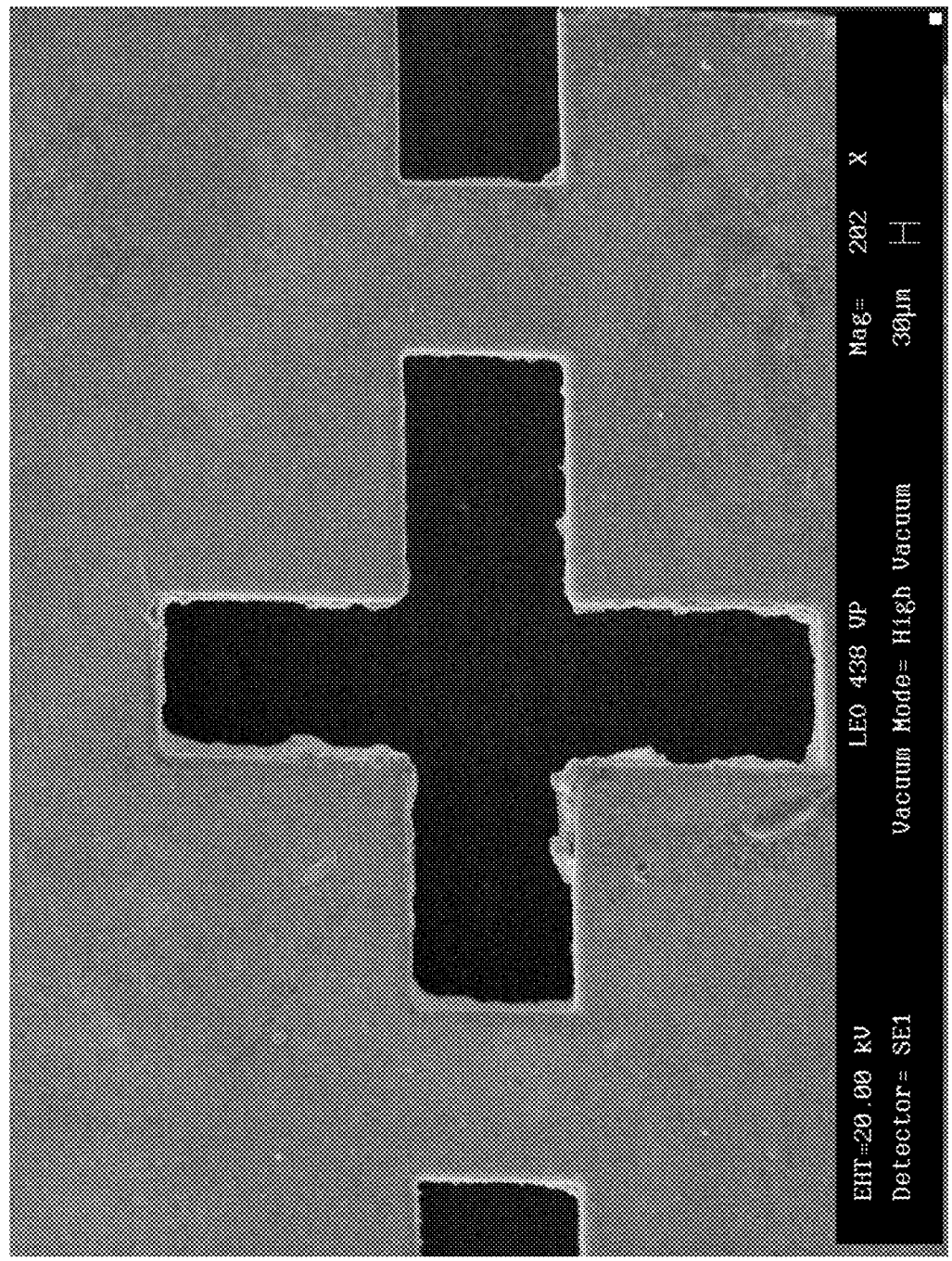
FIG. 7B is an SEM image of a plan view of the feature depicted in FIG. 7A.

In some embodiments, systems and methods described herein can be used to form through-substrate via holes. FIGS. 7A and 7B illustrate different views of a feature etched completely through a 400 µm thick bulk GaN substrate using systems and methods described in embodiments of the present disclosure. The feature was etched over a longer period of time, approximately 24 hours. The feature was etched entirely through the 400-micron thickness of the bulk GaN substrate 100. In some embodiments, features etched entirely through layers disposed over the front surface of the substrate enable access to deeper layers in a system from the front side of a layer stackup or even enable access to the front surface of the substrate 100. In some embodiments, through-substrate features etched entirely through the substrate from the back surface of the substrate enable access to deep layers disposed over the front surface of the substrate from the back side of the substrate. In some embodiments, systems and methods described herein enable dicing of wafers into smaller chips. Similar to the technique used to create features as shown in FIGS. 7A and 7B, the high aspect-ratio etching described herein can be used for device singulation by etching trenches through the substrate to separate different devices located at different positions on the substrate.

Figure 8:
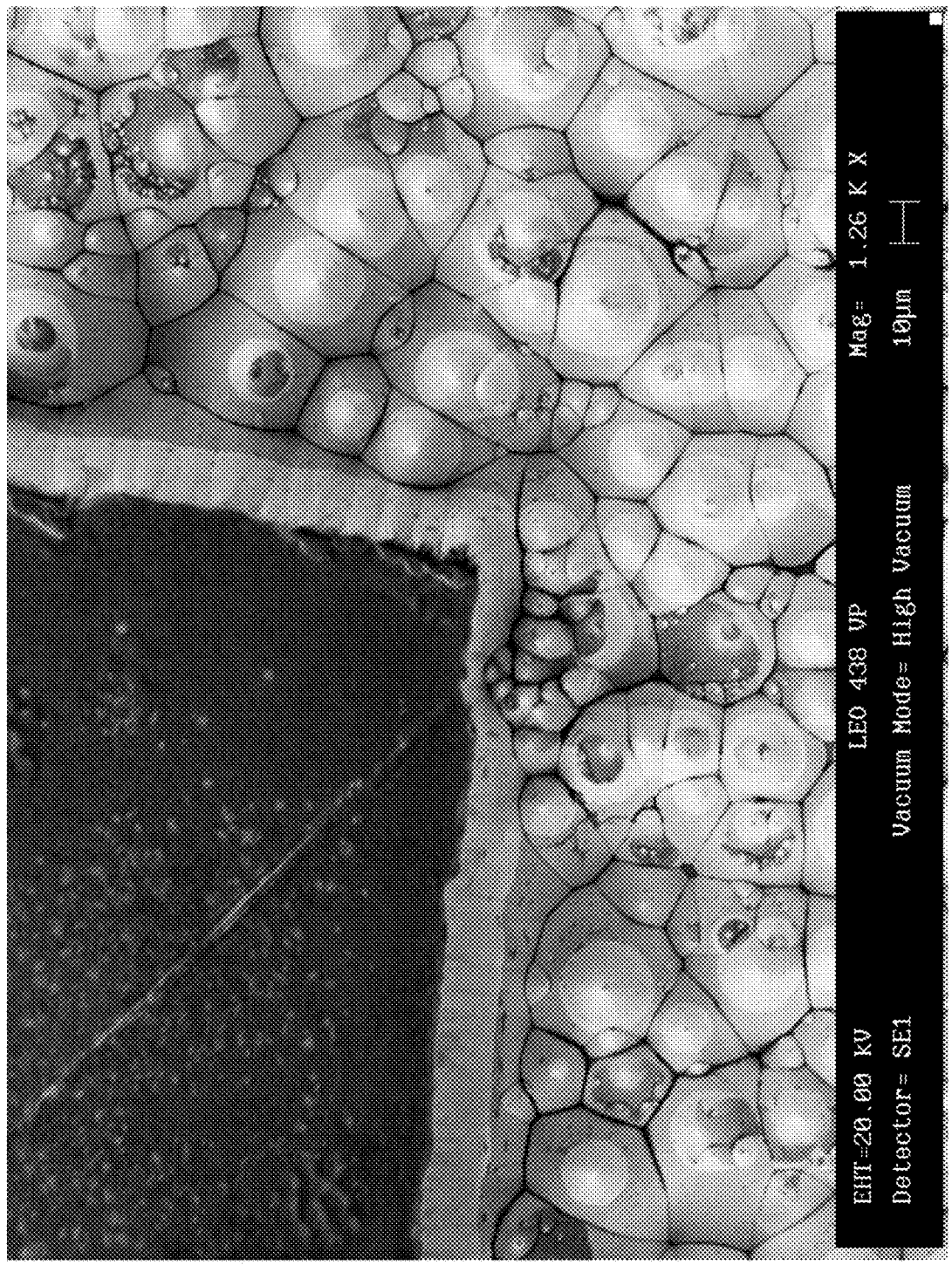
FIG. 8 is an SEM image of a plan view of nitrogen-face deep etching of a GaN substrate using a relatively higher concentration of KOH in the etching solution in accordance with some embodiments described herein.
Figure 9:
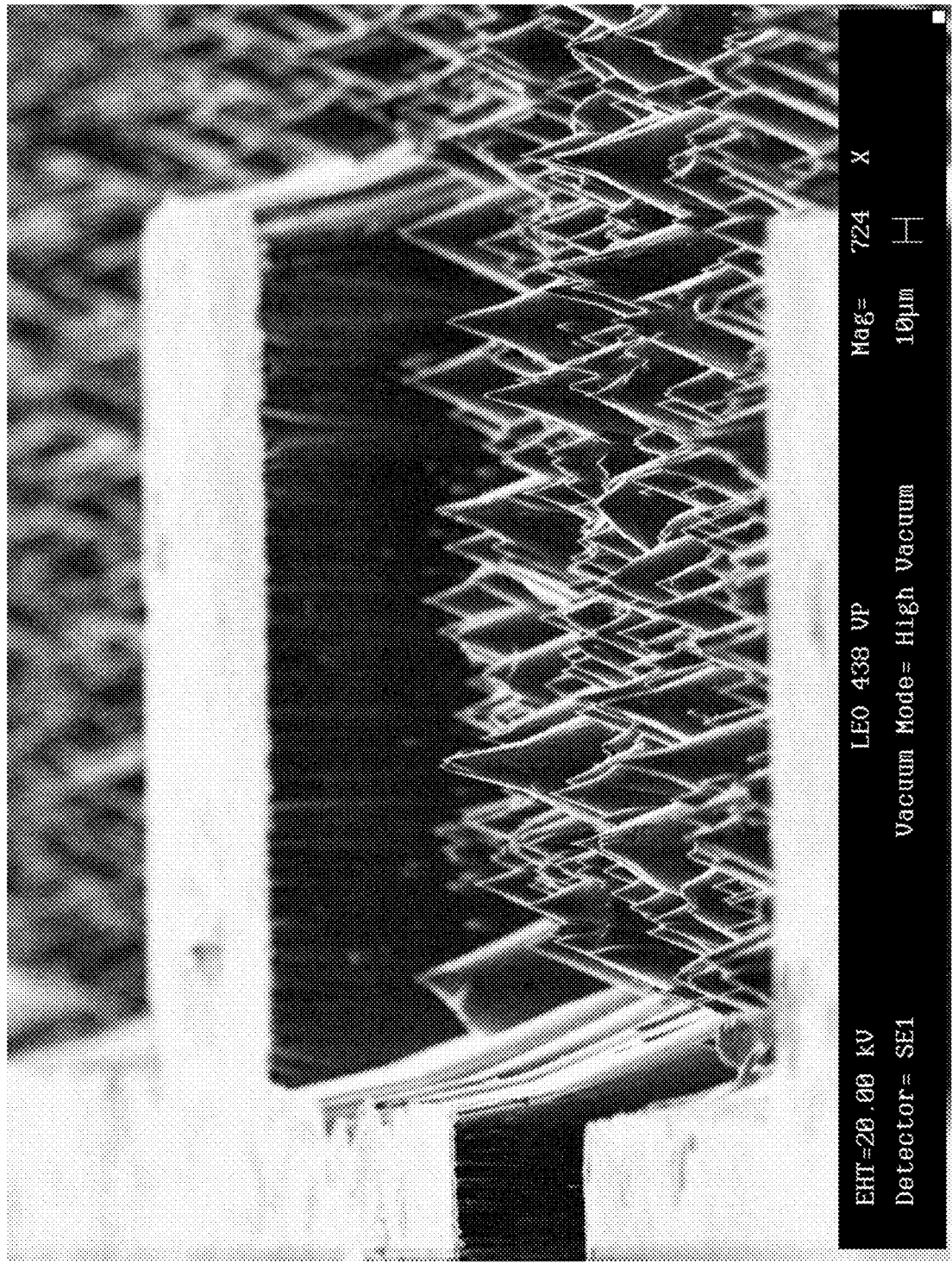
FIG. 9 is an SEM image of a perspective view of the etched GaN substrate of FIG. 8.

FIGS. 8-9 include SEM images of different views of nitrogen-face deep etching of a GaN substrate using a relatively higher concentration of KOH in the etching solution in accordance with various embodiments described herein. For a bulk GaN substrate, growth and etching of GaN typically occurs on the gallium face of the wafer for C-axis GaN materials. As such, the substrate 100 can be oriented such that the front surface 126 of the substrate 100 is the gallium face. However, etching of the nitrogen face (i.e., the back surface 127) has potential benefits. For example, etching of the nitrogen face can be used to thin the substrate 100 to reduce the thermal resistance. Due to the different crystallography of the nitrogen-face, large cones resulted from etching on the nitrogen face but not from etching on the gallium-face.

Figure 10:
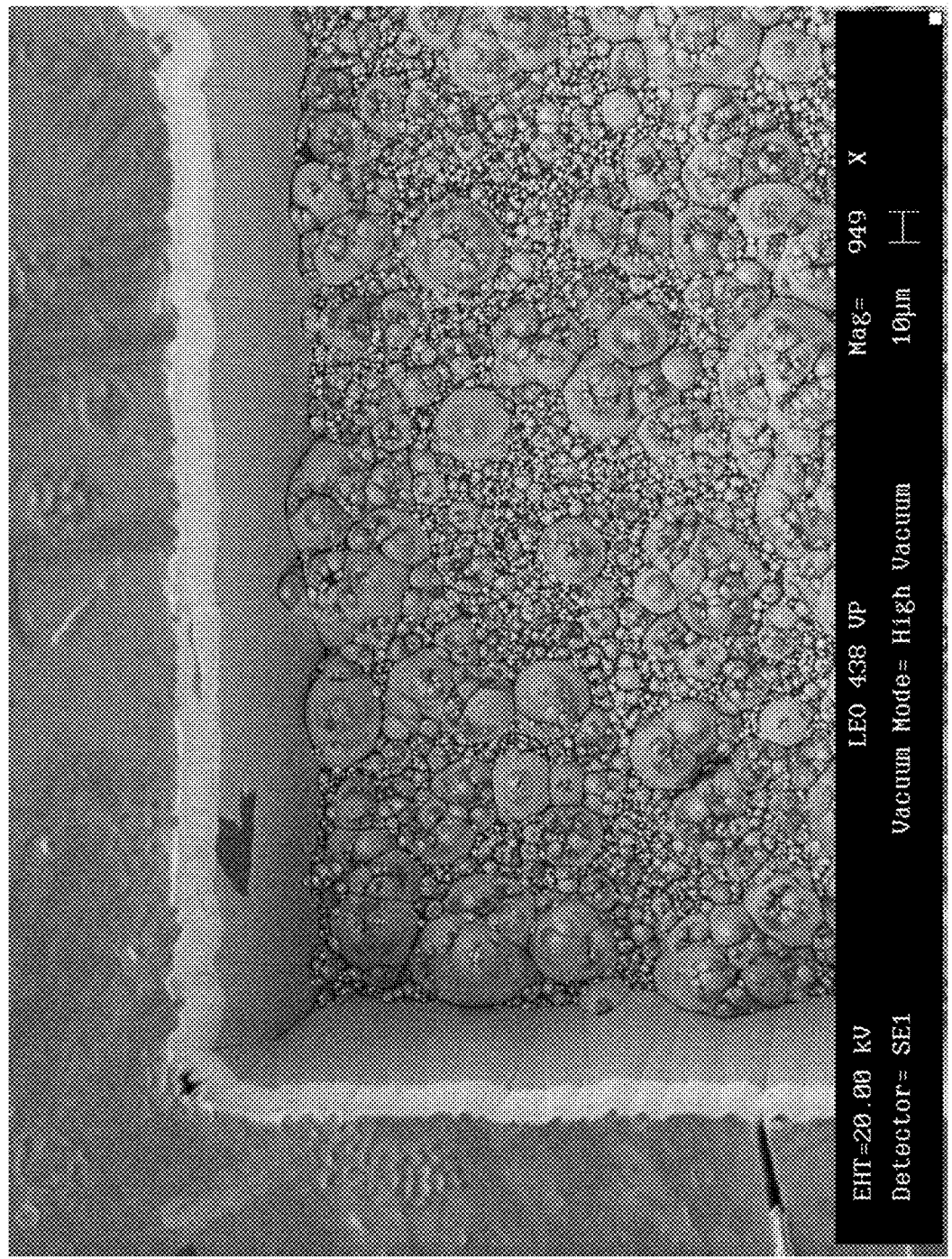
FIG. 10 is an SEM image of a plan view of nitrogen-face deep etching of a GaN substrate using a relatively lower concentration of KOH in the etching solution in accordance with some embodiments described herein.
Figure 11:
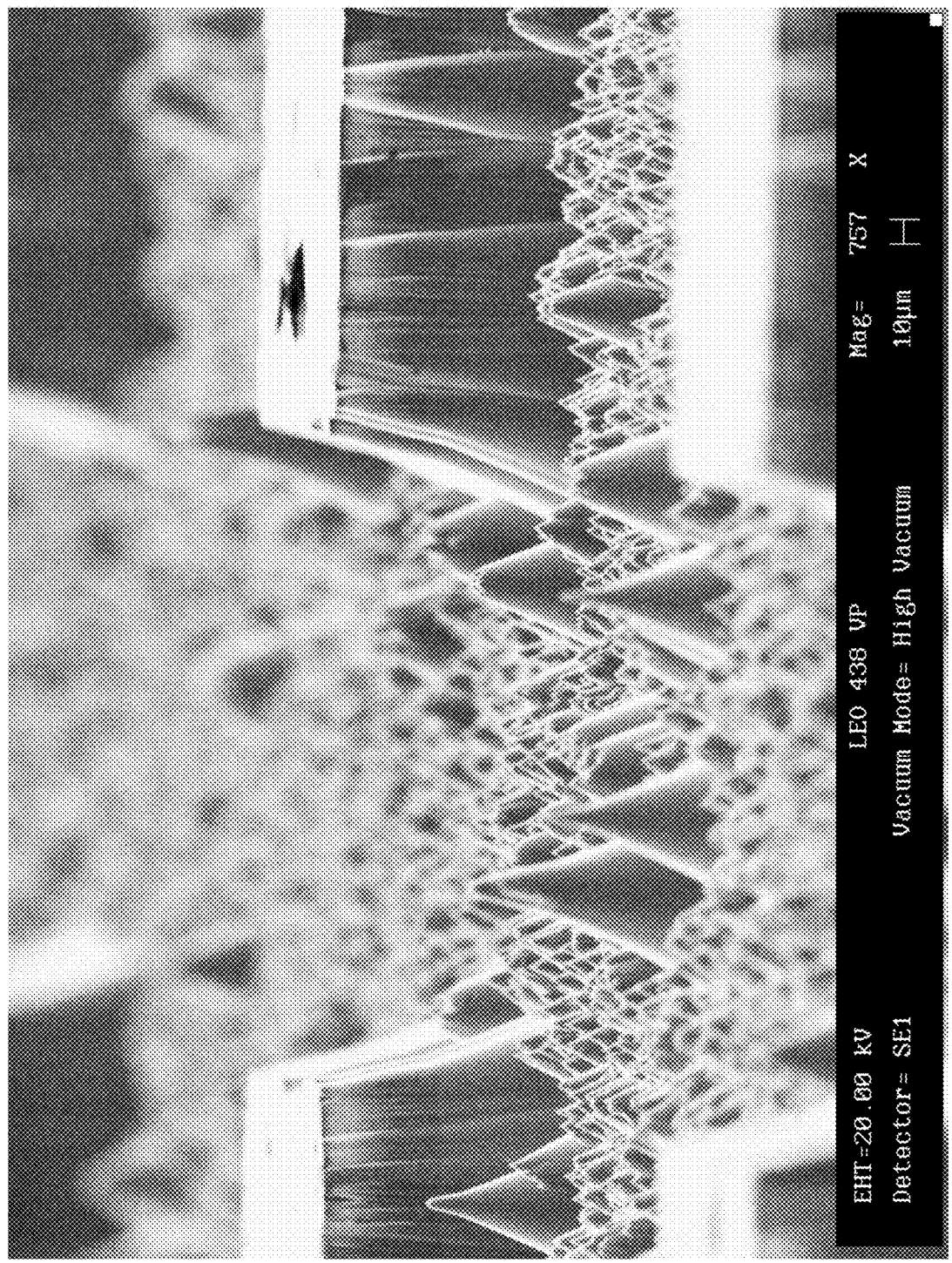
FIG. 11 is an SEM image of a perspective view of the etched GaN substrate of FIG. 10.

FIGS. 10-11 include SEM images of different views of nitrogen-face deep etching of a GaN substrate using a relatively lower concentration of KOH in the etching solution in accordance with various embodiments described herein. Cone formation is dependent upon KOH concentration. Where the substrate 100 shown in FIGS. 8-9 was exposed to a concentration of 1M KOH for 8 hours, the substrate shown in FIGS. 10-11 was exposed to 0.04M KOH for 8 hours. As shown in FIGS. 8-9, greater concentrations of the etchant chemicals (e.g., KOH) can create large cone structures whereas lower concentrations of etchant creates less pronounced cone structures. In some embodiments, reduced formation of cones or formation of cones of reduced size could be useful for fabricating a smooth back surface 127 and, thus, reducing thermal resistance when etching the back surface 127 of the substrate 100. Conversely, large cone formation could be desirable in some embodiments, e.g., to provide texturing to improve light extraction for a light emitting diode device.

Figure 12:
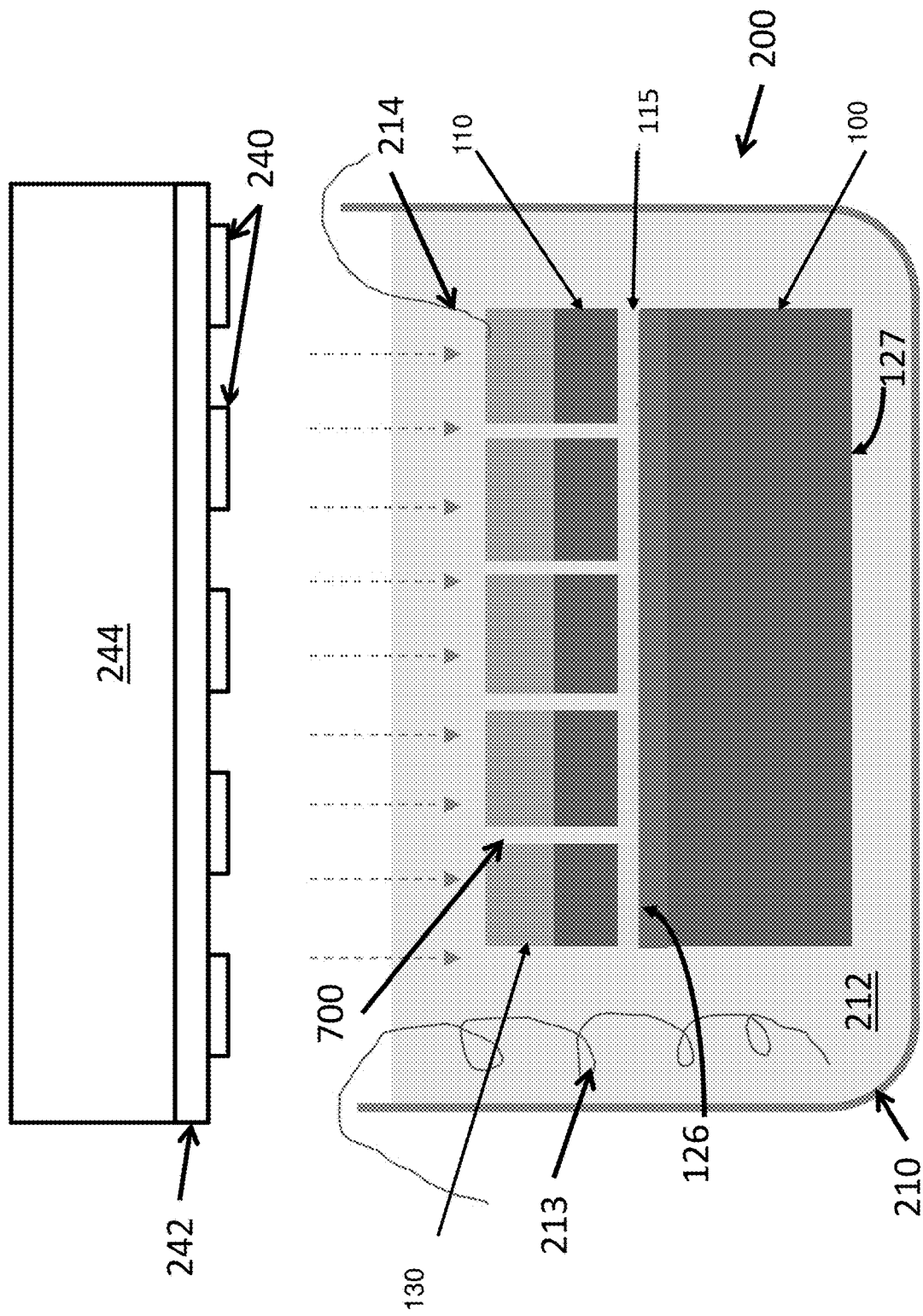
FIG. 12 schematically illustrates formation of perforations in a device structure in a photoenhanced vertical wet etch environment, according to an example embodiment.

FIG. 12 schematically illustrates formation of perforations 700 in an epitaxial device structure 110 in a photoenhanced vertical wet etch environment of system 200, according to an example embodiment. Perforations can perform several functions in an epitaxial device structure 110 including aiding lift-off or separation of the device structure 110 from the substrate 100. In accordance with some embodiments, a stackup including the device structure 110 and substrate 100 can be formed as follows. First, a release layer 115 is grown on or applied to the substrate 100. Then, one or more layers that make up the device structure 110 are grown or applied over the release layer 115. Finally, a support layer 130 is formed or applied over the device structure 110. For example, the support layer 130 can include a metal support layer in some embodiments. In some embodiments, the support layer 130 is deposited or formed by electroplating on the top surface of the device structure 110 (e.g., for GaN epitaxial device films). In an example embodiment, the support layer 130 is perforated at formation. Each of the one or more perforations 700 in the support layer 130 can include a cross-shaped feature or have a different shape, and may be provided at regular intervals on the support layer 130. In some embodiments, the perforated support layer 130 may be formed by patterning the support layer to form perforations in the support layer 130. In some embodiments, the support layer 130 can be deposited first without patterned perforations and the perforations can be selectively removed at the intended locations with an etching or ablation process. In some embodiments, a photoresist mold may be formed over a device layer, and then metal is deposited on, in or over the photoresist mold. In some embodiments, photolithography can be used to form a patterned seed metal layer. Then, electroplating can be used to grow the seed metal layer onto the patterned support layer 130. In an example embodiment, the support layer 130 is patterned with cross-shaped perforations 250-μm wide and on a pitch of at least 1 mm.

In some embodiments, the stackup including the device structure 110, perforated support layer 130, release layer 115, and substrate 100 is placed into the photoenhanced vertical wet etch environment of system 200 to extend the perforations in the support layer 130 vertically through the device structure 110 and to or through the release layer 115. In an example embodiment, the system 200 for vertically etching the perforations through the device structure 110 is substantially as described above with respect to FIG. 1 and includes at least one LED source 240 as described above with respect to FIG. 1.

The stackup is exposed to the photoenhanced vertical wet etch environment comprising an etching solution 212 (e.g., a KOH etching solution) to vertically etch perforations into the release layer 115 and the device layers 110, in accordance with some embodiments. The release layer 115 and the device layers 110 are etched with the same or similar pattern of the perforations on the support layer 130. The perforations in the support layer 130 enable the etchant in the etching solution 212 to access the release layer 115 and to etch away the release layer 115 simultaneously at multiple locations away from the edge of the stackup.

As described above, the stackup 100 is illuminated with broadband ultraviolet rays by the at least one LED source 240 to vertically etch the release layer 115 and the device layers 110. In some embodiments, the stackup 100 is illuminated such that the light first impinges upon the perforated support layer 130 and passes through the perforations in the support layer 130 to illuminate the portions of the device layers 110 and the release layer 115 underlying the perforations. At least some of the photons emitted by the LED sources 240 have an energy level greater than or equal to that of the first bandgap energy level of the release layer 115.

In an example embodiment, the bottom surface of the substrate 100 is covered with a transparent chemically protective layer prior to exposing the stackup to the photoenhanced vertical wet etch environment of the system 200. The transparent chemically protective layer may include one or more of spin-on glass, PECVD silicon oxide, ethylene vinyl acetate (EVA), bonded sapphire, and glass.

Figure 13:
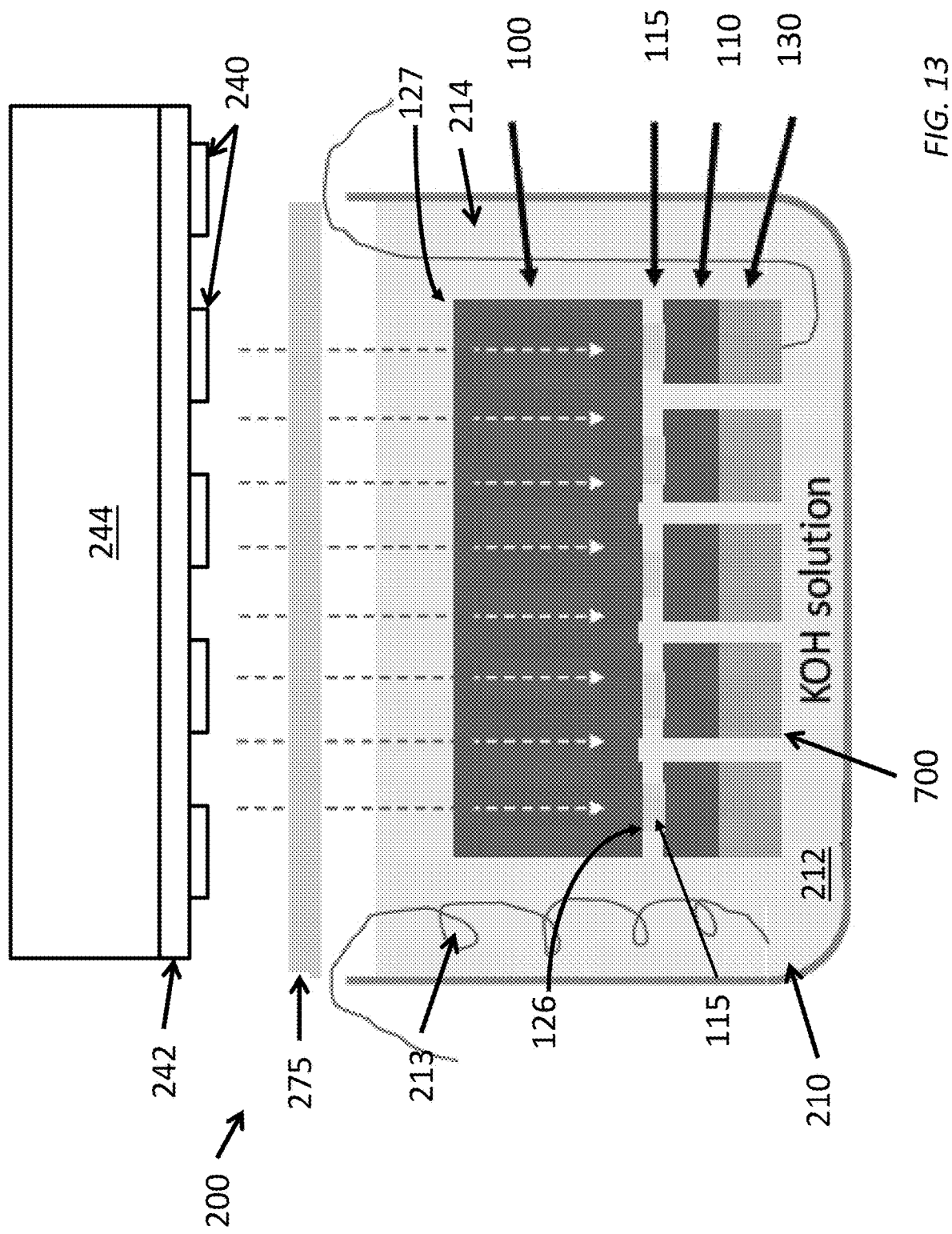
FIG. 13 schematically illustrates enhanced epitaxial lift-off of the perforated device structure from a substrate in a photoenhanced lateral wet etch environment in accordance with some embodiments described herein.

FIG. 13 illustrates enhanced epitaxial lift-off of the perforated device structure 110 from a substrate in a photoenhanced lateral wet etch environment of system 200 in accordance with various embodiments described herein. After vertical etching, the device structure 110 can be exposed to a photoenhanced lateral wet etch environment to selectively etch the release layer 115 and separate the device layers 110 and the support layer 130 from the substrate 100. In an example embodiment, illumination from the at least one LED source 240 is applied through the backside of the GaN or sapphire substrate to drive lateral etching of the release layer 115 (e.g., an InGaN release layer 115) from the perforations and from the edge of the substrate using a KOH etching solution 212. In some embodiments, the system 200 includes a filter 275 disposed between the at least one LED source 240 and the stackup. For example, the filter 275 can be a low-pass optical filter. The filter 275 can block light at high frequencies that will not be absorbed by the release layer 115 to avoid having this light etch layers other than the release layer 115. For example, the filter 275 can remove light at frequencies that will not aid in lift-off but will only be absorbed by another component in the stackup and cause etching to occur in that component such as in GaN material adjacent to the release layer 115.

In the configuration shown in FIG. 13, the photoenhanced lateral wet etch environment of the system 200 impinges photons on the release layer 115, where the photons have an energy level greater than or equal to that of the first bandgap energy level of the release layer 115. As illustrated by the configurations in FIGS. 12 and 13, the at least one LED source 240 and substrate 100 or stackup can be configured such that light from the at least one LED source 240 illuminates the front surface or the back surface of the substrate 100. For example, the system 200 can illuminate the bottom surface of the substrate 100 in cases where the substrate 100 is transparent at the frequency of illumination. Thus, the light will pass through the substrate 100 and interact with the first-grown layers of the stackup. In other embodiments, the system 200 can illuminate the front surface of the substrate 100. As a result, light will impinge first on the front surface (if no layers are grown on the substrate 100) or on the top layer of a stackup grown on the front surface of the substrate 100.

In an example embodiment, the substrate 100 has a diameter corresponding to a 2-inch to 8-inch wafer. In some embodiments, the etching of the release layer 115 to separate the one or more device layers 110 from the substrate 100 occurs on a 4-inch to 8-inch wafer size scale. In some embodiments, at least one surface of the substrate 100 can have a diameter of at least two inches (5.08 centimeters). In some embodiments, the diameter of the surface of the substrate 100 can lie in a range from about two inches (5.08 centimeters) to about eight inches (20.32 centimeters). In some embodiments, the diameter of the surface of the substrate 100 can lie in a range from about 4 inches (10.2 cm) to about 8 inches (20.3 cm). In some embodiments, the substrate has a diameter in a range of a 2-inch wafer sized substrate to an 8-inch wafer sized substrate. In some embodiments, the substrate has a diameter in a range of a 3-inch wafer sized substrate to an 8-inch wafer sized substrate. In some embodiments, the substrate has a diameter in a range of a 4-inch wafer sized substrate to an 8-inch wafer sized substrate. In some embodiments, the substrate has a size as recited above and comprises GaN. In some embodiments, the substrate has a size as recited above and one or more layers disposed on the substrate comprise GaN.

Figure 14:
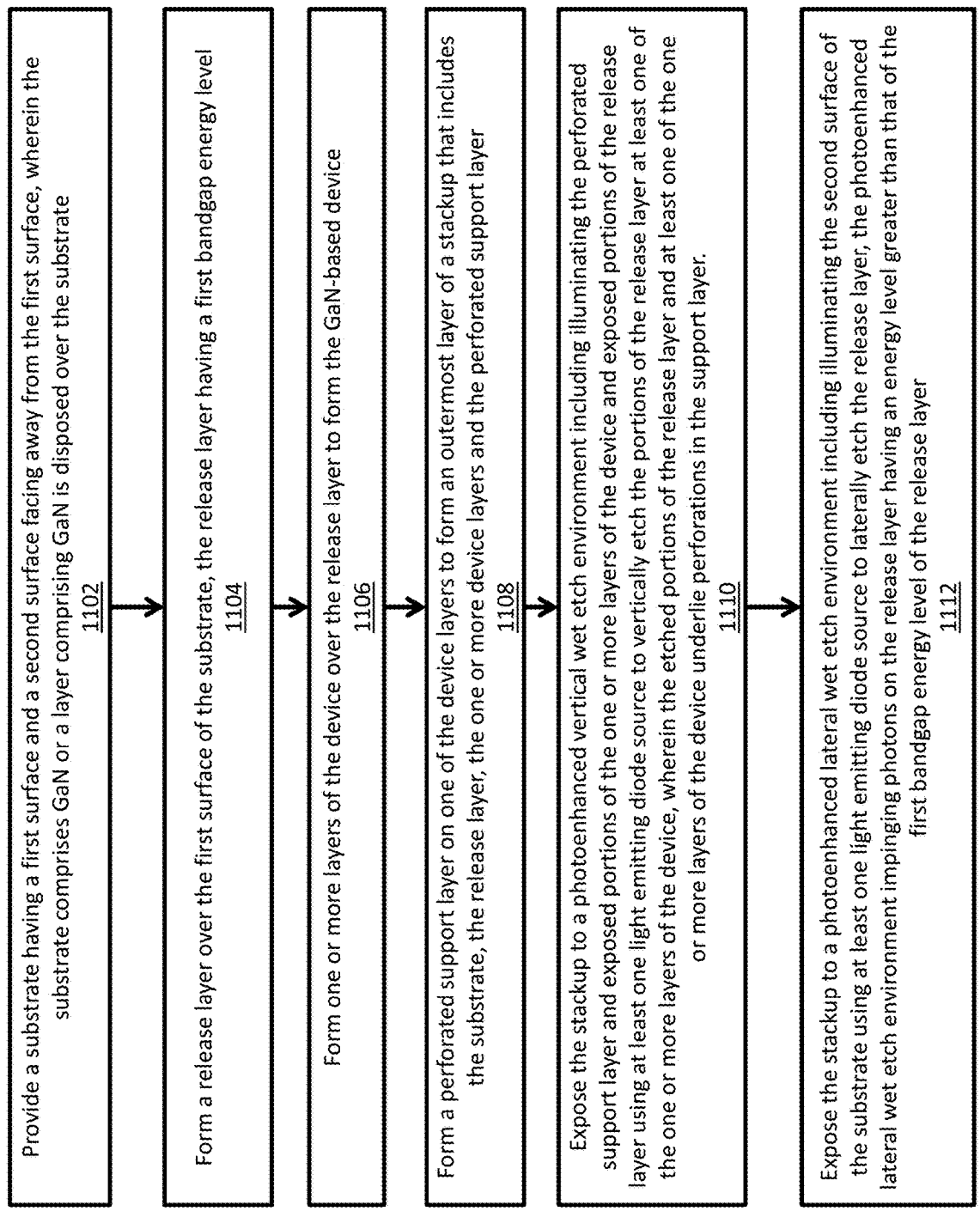
FIG. 14 is a flowchart for a method of forming a GaN-based device free of a substrate according to some embodiments described herein.

FIG. 14 is a flowchart for a method 1100 of forming a GaN-based device free of a substrate according to some embodiments described herein. The method 1100 includes providing a substrate 100 having a first surface 126 and a second surface 127 facing away from the first surface 127 (step 1102). The substrate 100 comprises GaN or a layer comprising GaN is disposed over the substrate. The method 1100 includes forming a release layer 115 over the first surface 126 of the substrate 100 (step 1104). The release layer 115 has a first bandgap energy level. The method 1100 includes forming one or more layers of the device (also referred to as the one or more device layers) 110 over the release layer 115 to form the GaN-based device (step 1106).

The method 1100 also includes forming a perforated support layer 130 on one of the one or more device layers 110 to form an outermost layer of a stackup that includes the perforated support layer, the one or more device layers, the release layer, and the substrate (step 1108). The method 1100 includes exposing the stackup including the stackup to a photoenhanced vertical wet etch environment including illuminating the perforated support layer 130 and exposed portions of the one or more layers 110 of the device and exposed portions of the release layer 115 using at least one light emitting diode source 240 to vertically etch the portions of the release layer 115 and at least one of the one or more layers 110 of the device (step 1100). The etched portions of the release layer 115 and at least one of the one or more layers 110 of the device underlie perforations in the support layer 130. The method 1100 includes exposing the stackup to a photoenhanced lateral wet etch environment including illuminating the second surface 127 of the substrate 100 using at least one light emitting diode source 240 to laterally etch the release layer 115. The photoenhanced lateral wet etch environment impinges photons on the release layer 115 having an energy level greater than or equal to that of the first bandgap energy level of the release layer 115.

Figure 15A:
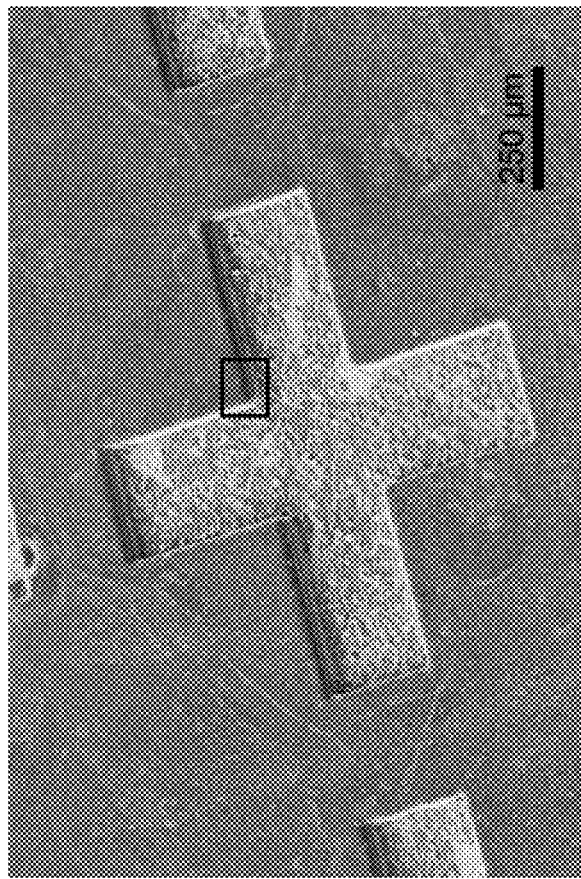
FIG. 15A is an SEM image of cross-shaped perforations formed in device layers grown on a bulk GaN substrate using systems and methods described in some embodiments of the present disclosure.
Figure 15B:
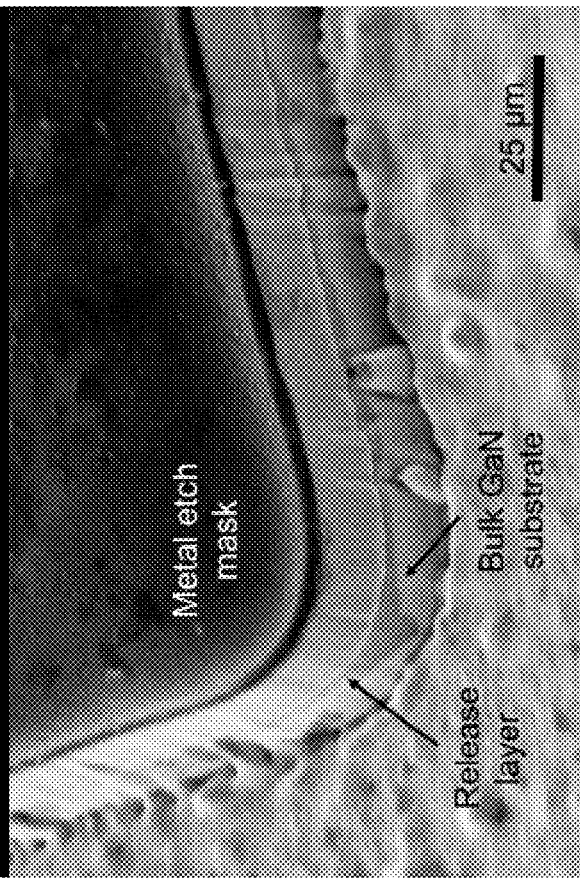
FIG. 15B is a detail SEM image of a portion of a cross-shaped perforation of FIG. 15A that shows distinct layers over and including the substrate.

FIG. 15A is an SEM image of perforations formed in device layers grown on a bulk GaN substrate using systems and methods described in some embodiments of the present disclosure. FIG. 15B is an SEM image of a detail of a portion of FIG. 15A that shows distinct device layers and the substrate. As shown, the vertical depth of the etched portion extends through the metal etch mask, the epitaxial GaN layer, the release layer, and into the bulk GaN substrate.

Figure 16:
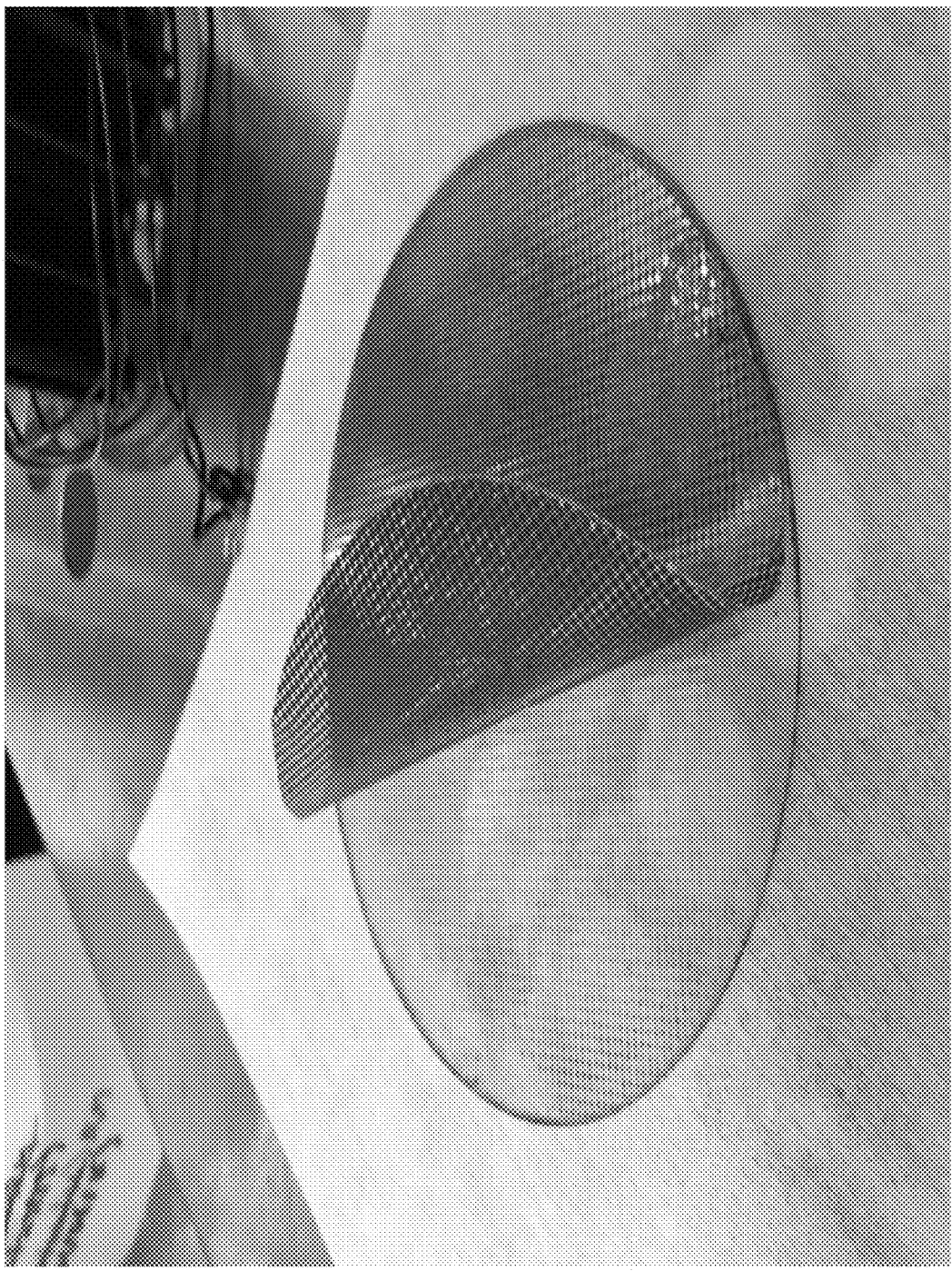
FIG. 16 is an image of resulting GaN device layers after 4 inch wafer-scale epitaxial lift off (ELO) from a sapphire substrate using systems and methods described in some embodiments of the present disclosure.

FIG. 16 is an image of a resulting GaN device after ELO from a sapphire substrate using systems and methods described in some embodiments of the present disclosure. The diameter of both the substrate and the resulting device layer is four inches.

Figure 17:
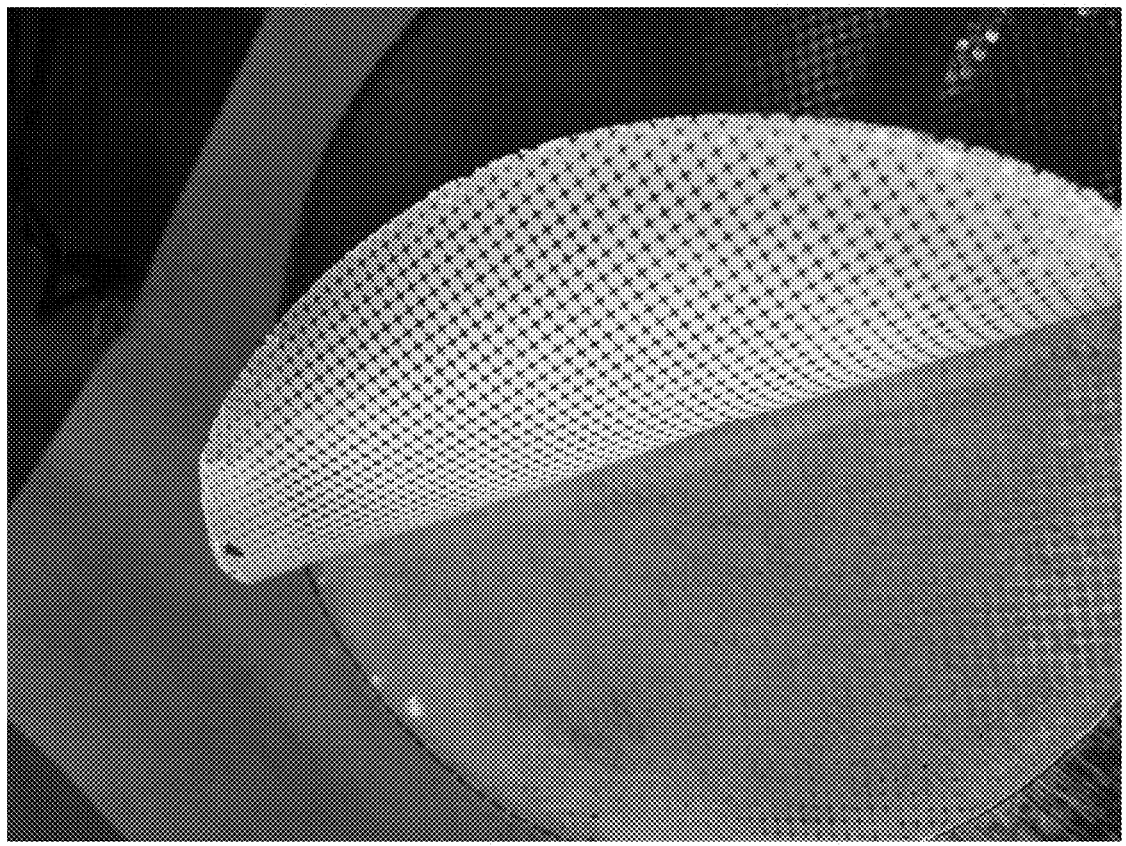
FIG. 17 is an image of the resulting substrate-free GaN device layers of FIG. 16 as illuminated using ultraviolet light.

FIG. 17 is an image of the GaN device of FIG. 16 as illuminated using ultraviolet light. The yellow luminescence of the nitrogen face of the released film is visible under ultraviolet illumination in this figure.

Figure 18:
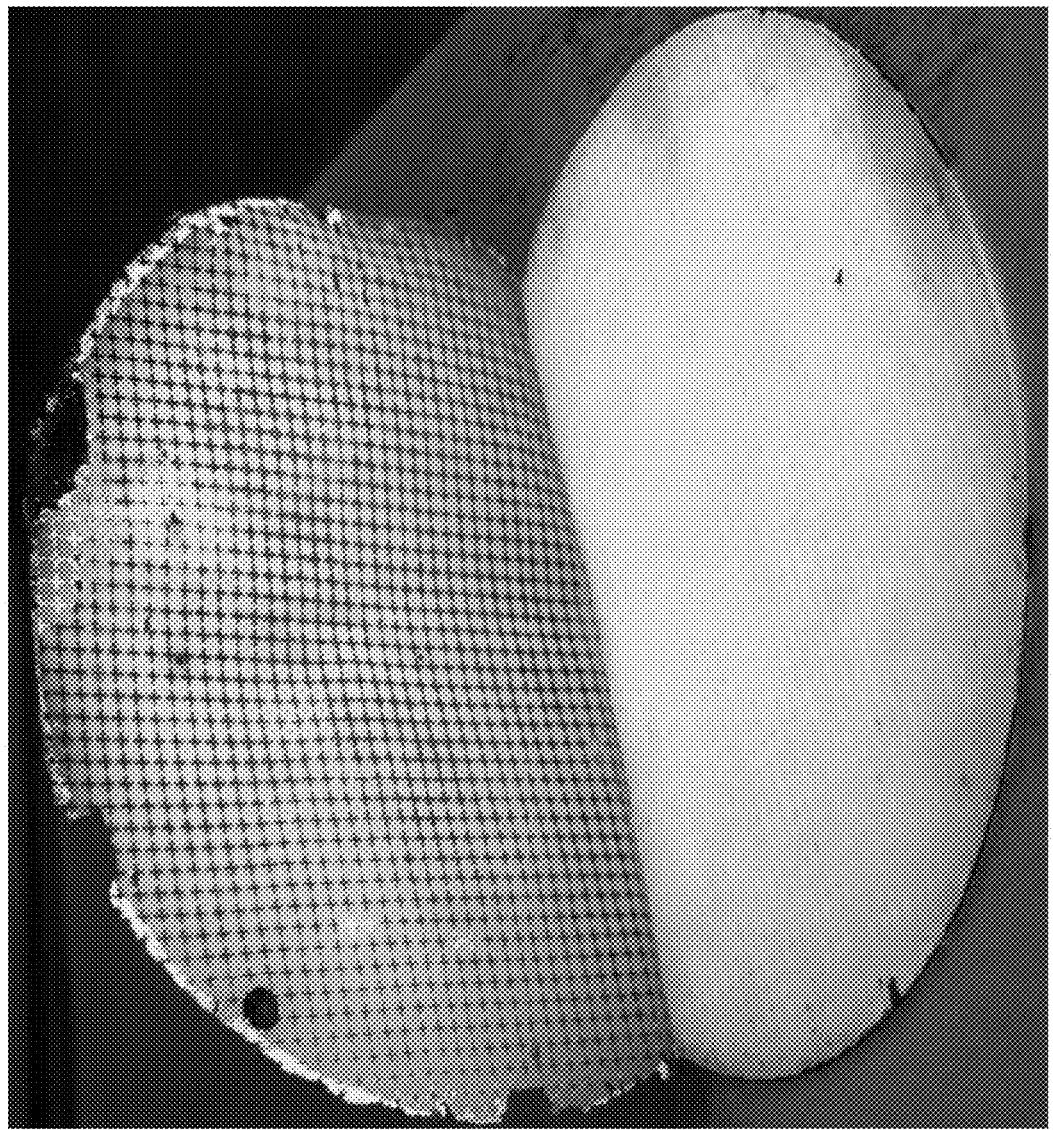
FIG. 18 is an image of resulting GaN device layers after 2-inch wafer-scale ELO from a bulk GaN substrate using systems and methods described in some embodiments of the present disclosure.

FIG. 18 is an image of a resulting GaN device after ELO from a bulk GaN substrate on a 2-inch wafer size scale using systems and methods described in some embodiments of the present disclosure.

Figure 19:
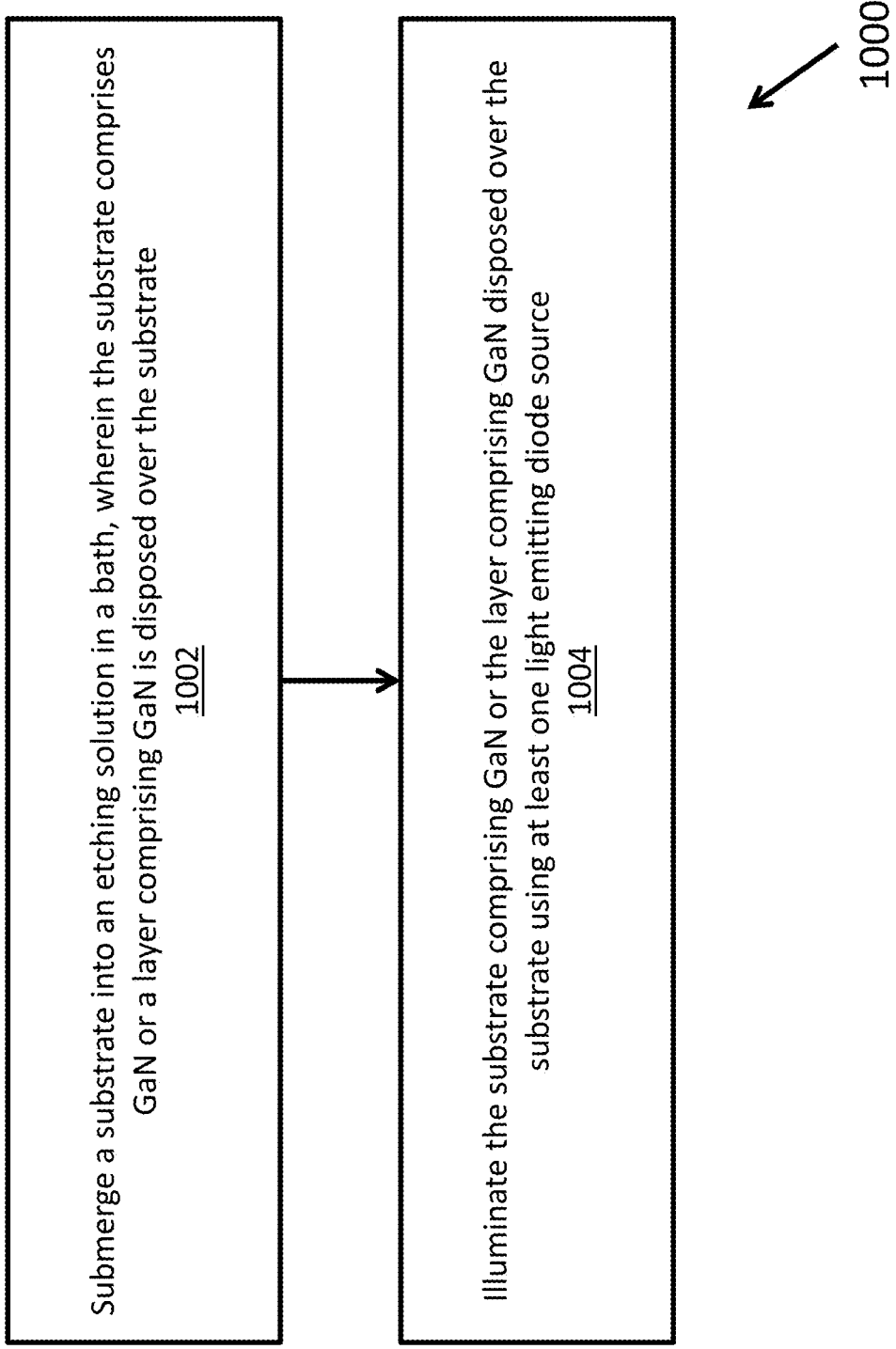
FIG. 19 is a flow chart of a method of etching a GaN substrate or a layer comprising GaN disposed on a substrate in accordance with some embodiments described herein.

FIG. 19 is a flow chart of a method of etching a substrate or a layer disposed on a substrate in accordance with various embodiments described herein. The method 1000 includes submerging a substrate 100 into an etching solution 212 in a bath 210 (step 1002). The substrate 100 comprises GaN or a layer disposed on the substrate 100 comprises GaN. In some embodiments, the substrate 100 comprises bulk GaN and additional layers comprising GaN are grown on the substrate 100. In some embodiments, the substrate does not include a III-V compound (e.g. the substrate is a sapphire substrate) and the layer disposed on the substrate comprises GaN. The method 1000 includes illuminating the substrate 100 using at least one light emitting diode source 240 (step 1004).

Although described herein with relation to GaN etching, the systems and methods of the present disclosure are not limited to use with GaN substrates or GaN layers grown upon other substrates and can be used to perform photoenhanced wet etching of a variety of semiconductor materials including other III-nitride materials.

Systems and methods described herein to perform photoenhanced deep etching can be used in a number of applications. For example, systems and methods described herein can be used for substrate thinning. For improved thermal conductivity, it is often desirable to thin a substrate before mounting it to a package. Systems and methods as described herein (such as system 200) can be used instead of mechanical grinding to carry out backside thinning of a substrate 100. For example, the front surface or back surface of the entire, unmasked substrate 100 can be subjected to photoenhanced etching to remove material evenly across the surface.

Systems and methods described herein can be used in the preparation of thermal via holes in some embodiments. Rather than thinning an entire substrate, localized large via holes can be etched into the back surface of a substrate. The large via holes can be filled with a thermally conductive material to improve thermal conductivity between the front surface of the device and a mounting substrate attached to the back surface.

System and methods described herein can be used in the fabrication of microelectromechanical structures (MEMS). Large-scale (tens to hundreds of microns) mechanical structures for MEMS devices can be fabricated in bulk GaN materials using the system 200. Structures such as springs or cantilevers can be set apart from surrounding substrate by etching deep trenches to define the structure followed by a lateral etch process to undercut the feature and release from the substrate.

In some embodiments, the LED-based approaches described herein provide low cost and scalability. For example, the low cost and compactness of the light source can provide etching of large batches of many wafers in parallel.

Although some specific embodiments are described above with respect to systems and methods for etching materials including GaN, the teachings herein also apply to systems and methods for etching other III-nitride materials, such as AlN. Other embodiments include systems and method for etching materials including AlN.

In describing exemplary embodiments, specific terminology is used for the sake of clarity. For purposes of description, each specific term is intended to at least include all technical and functional equivalents that operate in a similar manner to accomplish a similar purpose. Additionally, in some instances where a particular exemplary embodiment includes a plurality of system elements, device components or method steps, those elements, components or steps may be replaced with a single element, component, or step. Likewise, a single element, component, or step may be replaced with a plurality of elements, components, or steps that serve the same purpose. Moreover, while exemplary embodiments have been shown and described with references to particular embodiments thereof, those of ordinary skill in the art understand that various substitutions and alterations in form and detail may be made therein without departing from the scope of the present disclosure. Further still, other aspects, functions, and advantages are also within the scope of the present disclosure.

Exemplary flowcharts are provided herein for illustrative purposes and are non-limiting examples of methods. One of ordinary skill in the art recognizes that exemplary methods may include more or fewer steps than those illustrated in the exemplary flowcharts, and that the steps in the exemplary flowcharts may be performed in a different order than the order shown in the illustrative flowcharts.

The invention claimed is:

1. A method of etching GaN, comprising:
   submerging a substrate having a diameter of at least two inches (5.08 centimeters) into an etching solution in a bath, wherein the substrate comprises GaN or a layer comprising GaN is disposed over the substrate; and
   illuminating an entire surface of the substrate comprising GaN or an entire surface of the layer comprising GaN disposed over the substrate with an intensity of light in a range from 1 W/cm$^2$ to 10 W/cm$^2$ using at least one light emitting diode (LED) source outputting an intensity of light in a range from 1 W/cm$^2$ to 40 W/cm$^2$.

2. The method of claim 1, wherein the diameter of the surface of the substrate is in a range from two inches (5.08 centimeters) to eight inches (20.32 centimeters).

3. The method of claim 1, wherein the diameter of the surface of the substrate is in a range from 10 cm to 20.3 cm.

4. The method of claim 1, wherein the intensity is in a range from 2 W/cm$^2$ to 7 W/cm$^2$.

5. The method of claim 1, wherein the at least one etching parameter is etch depth, etched feature width, or surface roughness, and a variation for the at least one etching parameter across a surface of the substrate of less than 10%.

6. The method of claim 1, wherein the at least one LED source includes a plurality of LED sources arranged in an array.

7. The method of claim 1, wherein illuminating the substrate comprising GaN or the layer comprising GaN disposed over the substrate using at least one light emitting diode source includes emitting radiation having a nominal emission wavelength of 365 nm.

8. The method of claim 1, further comprising stirring the etching solution.

9. The method of claim 1, wherein illuminating the substrate includes illuminating a front surface or a back surface of the substrate.

10. The method of claim 1, wherein a resulting etched structure in the substrate or in one or more layers on the substrate including the layer comprising GaN has a depth of greater than 10 micrometers.

11. The method of claim 10, wherein the resulting etched structure has a depth in a range from 10 micrometers to 1 mm.

12. The method of claim 10, wherein the resulting etched structure has a depth in a range from 10 micrometers to 500 micrometers.

13. The method of claim 1, wherein a resulting etched structure extends entirely through the substrate and a total thickness etched where a distance that the etch extends entirely through the substrate is in a range from 10 micrometers to 1 mm.

14. The method of claim 13, wherein the resulting etched structure has a depth in a range from 10 micrometers to 500 micrometers.

15. The method of claim 1, wherein a resulting structure is etched into the substrate or into one or more layers on the substrate including the layer comprising GaN at a rate of between 3 micrometers per hour and 250 micrometers per hour.

16. The method of claim 15, wherein the resulting structure is etched into the substrate or into one or more layers on the substrate including the layer comprising GaN at a rate of between 3 micrometers per hour and 100 micrometers per hour.

17. The method of claim 16, wherein the resulting structure is etched into the substrate or into one or more layers on the substrate including the layer comprising GaN at a rate of between 9 micrometers per hour and 20 micrometers per hour.

18. The method of claim 1, wherein the etching solution includes potassium hydroxide (KOH).

19. The method of claim 18, wherein the molarity of KOH in the etching solution is in a range from 0.01 M to 10 M.

20. The method of claim 19, wherein the molarity of KOH in the etching solution is in a range from 0.01 M to 1 M.

21. The method of claim 1, further comprising forming a perforated layer over the substrate comprising GaN or over the layer comprising GaN disposed over the substrate;
   wherein illuminating the substrate or the layer comprising GaN disposed over the substrate causes vertical etching of the substrate comprising GaN or of the layer comprising GaN disposed over the substrate at perforations of the perforated layer.

22. The method of claim 1, wherein the substrate comprises GaN.

23. The method of claim 22, wherein the substrate comprises a GaN wafer.

24. A system for photoenhanced etching of GaN, comprising:
   a bath including an etching solution into which a substrate is submerged, wherein the substrate comprises GaN or a layer comprising GaN is disposed over the substrate; and
   at least one light emitting diode source to illuminate the substrate comprising GaN or the layer comprising GaN disposed over the substrate,
   wherein a surface of the substrate has a diameter in a range of two inches (5.08 centimeters) to eight inches (20.32 centimeters) and wherein an intensity of light provided by the system across the entire surface of the substrate or across the entire surface of the layer comprising GaN disposed over the substrate is in a range from 1 W/cm$^2$ to 10 W/cm$^2$.

25. The method of claim 1, wherein the method is also a method for forming a GaN-based device free of a substrate and further comprises:

providing the substrate having a front surface and a back surface facing away from the front surface;

forming a release layer over the front surface of the substrate, the release layer having a first bandgap energy level;

forming one or more layers of the device over the release layer to form the GaN-based device; and forming a perforated support layer on one of the device layers to form an outermost layer of a stackup that includes the substrate, the release layer, the one or more device layers and the perforated support layer, wherein illuminating the substrate comprises:

exposing the stackup to a photoenhanced vertical wet etch environment including illuminating the perforated support layer and exposed portions of the one or more layers of the device and exposed portions of the release layer using the at least one light emitting diode source to vertically etch the portions of the release layer and at least one of the one or more layers of the device, wherein the etched portions of the release layer and at least one of the one or more layers of the device underlie perforations in the support layer; and exposing the stackup to a photoenhanced lateral wet etch environment including illuminating the second surface of the substrate using the at least one light emitting diode source to laterally etch the release layer, the photoenhanced lateral wet etch environment impinging photons on the release layer having an energy level greater than or equal to that of the first bandgap energy level of the release layer.

\* \* \* \* \*